US006447604B1

(12) United States Patent
Flynn et al.

(10) Patent No.: US 6,447,604 B1
(45) Date of Patent: Sep. 10, 2002

(54) METHOD FOR ACHIEVING IMPROVED EPITAXY QUALITY (SURFACE TEXTURE AND DEFECT DENSITY) ON FREE-STANDING (ALUMINUM, INDIUM, GALLIUM) NITRIDE ((AL,IN,GA)N) SUBSTRATES FOR OPTO-ELECTRONIC AND ELECTRONIC DEVICES

(75) Inventors: Jeffrey S. Flynn, Litchfield; George R. Brandes, Southbury; Robert P. Vaudo, New Milford, all of CT (US); David M. Keogh, San Diego, CA (US); Xueping Xu, Stamford; Barbara E. Landini, New Milford, both of CT (US)

(73) Assignee: Advanced Technology Materials, Inc., Danbury, CT (US)

( * ) Notice: Subject to any disclaimer, the term of this patent is extended or adjusted under 35 U.S.C. 154(b) by 0 days.

(21) Appl. No.: 09/605,195

(22) Filed: Jun. 28, 2000

Related U.S. Application Data

(63) Continuation-in-part of application No. 09/524,062, filed on Mar. 13, 2000.

(51) Int. Cl.$^7$ ............................ C30B 25/14; C30B 29/40
(52) U.S. Cl. .............................. 117/89; 117/93; 117/94; 117/95; 117/952
(58) Field of Search ............................... 117/89, 93, 94, 117/95, 952

(56) References Cited

U.S. PATENT DOCUMENTS

| | | | |
|---|---|---|---|
| 3,598,526 A | 8/1971 | Huml et al. | |
| 3,607,014 A | 9/1971 | Huml et al. | |
| 5,006,914 A | 4/1991 | Beetz et al. | |
| 5,030,583 A | 7/1991 | Beetz et al. | |
| 5,204,314 A | 4/1993 | Kirlin et al. | |
| 5,411,914 A | * 5/1995 | Chen et al. | 437/105 |
| 5,536,323 A | 7/1996 | Kirlin et al. | |
| 5,679,152 A | 10/1997 | Tischler et al. | |
| 5,770,887 A | 6/1998 | Tadatomo | |
| 5,919,305 A | * 7/1999 | Solomon | 117/90 |

OTHER PUBLICATIONS

G.A. Slack & T.F. McNelly, J. Cryst. Growth, vol. 34, p. 263, (1976).
J. Pastrnak & L. Roskovocova, Phys. Stat. Sol, vol. 7, p. 331, (1964).
Rojo, Materials Research Society, Dec. 1999, "Preparation and Characterization of Single Crystal Aluminum Nitride Substrates").
J. Karpinski, J. Jum and S. Porowski, J. Cryst. Growth, vol. 66 (1984). Equilibrium Pressure of $N_2$ over GaN and High Pressure Solution Growth of GaN.
J. Karpinski and S. Porowski, Journal of Crystal Growth, vol. 66, (1984), 11–20 High Pressure Thermodynamics of GaN.
S. Porowski J. Cryst. Growth, 189/190, (1998), 153.

(List continued on next page.)

Primary Examiner—Robert Kunemund
(74) Attorney, Agent, or Firm—Oliver A. Zitzmann; Steven J. Hultquist; Margaret Chappuis

(57) ABSTRACT

A III-V nitride homoepitaxial microelectronic device structure comprising a III-V nitride homoepitaxial epi layer on a III-V nitride material substrate, e.g., of freestanding character. Various processing techniques are described, including a method of forming a III-V nitride homoepitaxial layer on a corresponding III-V nitride material substrate, by depositing the III-V nitride homoepitaxial layer by a VPE process using Group III source material and nitrogen source material under process conditions including V/III ratio in a range of from about 1 to about $10^5$, nitrogen source material partial pressure in a range of from about 1 to about $10^3$ torr, growth temperature in a range of from about 500 to about 1250 degrees Celsius, and growth rate in a range of from about 0.1 to about 500 microns per hour. The III-V nitride homoepitaxial microelectronic device structures are usefully employed in device applications such as UV LEDs, high electron mobility transistors, and the like.

73 Claims, 21 Drawing Sheets

EPITAXIAL PROCESS 2 TO
PROPAGATE THE GaN EPITAXY

OTHER PUBLICATIONS

D. Elwell & M. Elwell, Prog. Cryst. Growth & Charact., vol. 17, p. 53, (1988).

C. Wetzel, D. Volm, B.K. Meyer, et al, Appl. Phys. Lett., vol. 65, p. 1033 (1994).

C.M. Balkas, Z. Sitar, T. Zheleva, et al.., Mat. Res. Soc. Proc., vol. 449, p. 41, (1997).

M.K. Kelly, O. Ambacher, R. Dimitrov, H. Angerer, R. Handschuh, & M. Stutzmann, Mat. Res. Soc. Symp. Proc. vol. 482, (1998), 973.

T. Detchprohm, K. Hiramatsu, H. Amano, & L. Akasaki, Appl. Phys. Lett. vol. 61, (1992), 2688.

Y. Melnik, A. Nikolaev, I. Nikitina, K. Vassilevski, V. Dimitriev, Mat. Res. Soc. Symp. Proc. vol. 482, (1998) 269.

S. Nakamura, M. Senoh, S. Nagahama, N. Iwasa, T. Yamada, T. Matsushita, H. Kiyoku, Y. Sugimoto, T. Kozaki, H. Umemoto, M. Sano, & J. Chocho, Jpn. J. Appl. Phys. vol.. 37, p. L309 (1998).

Matsunami, W.S. Yoo, PhD Thesis, Apr. 1991, Kyoto University.

H. Iwasaki, et al., Appl. Phys. Lett., vol. 63, p. 2636 (1993).

D.J. Larkin, P.G. Neudeck, J.A. Powell & L.G. Matus, Appl. Phys. Lett., vol. 65, p. 1659 (1994).

S. Nakamura, T. Mukai, M. Senoh, Jpn. J. Appl. Phys., vol. 31, p. 2885 (1992).

C.O. Dugger, Mat. Res. Bull., vol. 9, p. 331, (1974).

S. Porowski, M. Bockowski, B. Lucznik, et al., Mat. Res. Soc. Symp. Proc., vol. 449, p. 35, (1997).

R. A. Logan & C.D. Thurmond, J. Electrochem. Soc., vol. 119, p. 1727, (1972).

P.M. Dryburgh, The Ninth International Conf. On Cryst. Growth, ICCG–9, (1989).

G.A. Slack and T.F. McNelly, Journal of Crystal Growth, vol. 42, (1977), pp. 560–563.

Sarney, et al., "TEM studies of bulk AlN by physical vapor transport", Fall Materials Research Society, Boston, Mass, 1999, Session W5–5.

Nickolaev, et al., "AlN wafers fabricated by HVPE", Fall Materials Research Society, Boston, Mass, 1999, Session W6.5.

Ivantsov, et al., "GaN 20 mm diameter ingots grown from melt–solution by seeded technique", Fall Materials Research Society, Boston, Mass., 1999, Session W6.6.

Miskys, ICN83, Montpeillier 1999.

Kuramoto, et al., JJAP, vol. 38 (199), pp. L184–L186.

Marchand, et al. MRS Internet J. Nitride Semiconductor Research, 4S1, G4.5, (1999).

S.T. Kim, et al, "Preparation and properties of free–standing HVPE grown GaN substrates", Journal of Crystal Growth, vol. 194, (1998), pp. 37–42.

Hisao Sato, et al., "Surface Pretreatment of Bulk GaN for Homoepitaxial Growth by Metalorganic Chemical Vapor Deposition", Jpn. J. Appl. Phys., vol. 37 (1998), pp. 626–631.

Shuji Nakamura, et al., "InGaN/GaN/AlGaN–based laser diodes with cleaved facets grown on GaN substrates", Applied Physics Letters, vol. 73, No. 6, pp. 832–834.

Shuji Nakamura, "InGaN/GaN/AlGaN–based laser diodes grown on free–standing GaN substrates", Materials Science and Engineering B59 (1999), pp. 370–375.

Olga Kryliouk, et al., "Large Area GaN substrates", Materials Science and Engineering, B66, (1999), pp. 26–29.

F.A. Ponce, et al., "Homoepitaxy of GaN on polished bulk single crystals by metalorganic chemical vapor deposition", Appl. Phys. Lett., 68, (7), (1996).

Akira Usui, "High Quality and Thick GaN Substrate Epitaxially Grown by VPE Lateral Overgrowth", IEEE Lasers and Electro–Optics Society, 1998 Annual Meeting Dec. 1–4, 1998, vol. 1, IEEE Catalog No. 98CH36243, ISSN: 1092–8081, pp. 362–363.

Paul D. Brown, "TEM assessment of GaN epitaxial growth", Journal of Crystal Growth, 210, (2000), 143–150.

Amano, et al. Applied Physics Letters, 48, p. 353 (1986).

Nakamura, et al., JJAP, 30m, L1705, (1991).

Doolittle, et al., Journal of Vacuum Science and Technology B, Jun. 1998, vol. 16, No. 3, 1300–4.

Vaudo, et al., $6^{th}$ WBG Workshop, Mar. 2000, Richmond VA.

Mukai, et al., JJAP, vol. 38 (1999), pp. 5735–5739.

Zauner, et al., MRS Fall 1999, (W6.3).

Ohtoshi, et al., JJAP, vol. 35 (1996), Pt 2, No. 12A.

Park, et al., Physical Review B., vol. 59, No. 7, Feb. 15, 1999–I.

Gil, et al, Materials Science Formu, 264–268 (1998) pp. 1265–1270.

Ohtoshi, et al., Journal of Applied Physics, Aug. 15, 1997.

Duo, et al, IEEE Journal of Quantum Electronics, vol. 34, No. 7, Jul. 1998.

Onodera et al., IEEE Transactions on electron devices, vol. 3, No. 9, Sep. 1989.

Asbeck, et al., IEEE Transactions on electron devices, vol. ED–31, No. 10, Oct. 1984.

Ishida, et al, IEEE Electron device Letters, vol. 16, No. 10, Oct. 1995.

Chen, et al. IEEE Transactions on electron devices, vol. ED–34, No. 7, Jul. 1987.

Benamra, et al, Falll MRS 1999 (W5.8).

Nitta, et al, Fall MRS 1999 (W2.8/01.8).

Lee, K.N., et al., Journal of Electrochemical Society, vol. 147, No. 8, Aug. 2000, pp. 3087–3090, "Surface Chemical treatment for the cleaning of AlN and Gan surfaces".

Mistys, C.R., et al., "Applied Physics Letters, vol. 77, No. 12, Sep. 18, 2000, pp. 1858–1860, GaN homoepitaxy by metal organic chemical–vapor deposition on free–standing GaN substrates".

Martinez, G.L., et al., Journal of Electronic Materials, vol. 29, No. 3, Mar. 2000, "Surface recombination and sulfide passivation of GaN".

Seoung–Hwan, Park, Japanese Journal of Applied Physics, Part I, vol. 39, No. 6A, Jun. 2000 "Crystal orientation effects on electronic properties of wurtzite GaN/AlGaN quantum wells with spontaneous and piezoelectric polarization".

Zheleva, et al., MRS Internet J. Nitride Semiconductor Research, 4S1, G3.38 (1999).

* cited by examiner

FIG. 32B EPITAXIAL PROCESS 1 TO SMOOTH GaN SUBSTRATE

FIG. 32C EPITAXIAL PROCESS 2 TO PROPAGATE THE GaN EPITAXY

- FS GaN
- 10um HVPE GaN/SAPPHIRE
- SAPPHIRE

METHOD FOR ACHIEVING IMPROVED EPITAXY QUALITY (SURFACE TEXTURE AND DEFECT DENSITY) ON FREE-STANDING (ALUMINUM, INDIUM, GALLIUM) NITRIDE ((AL,IN,GA)N) SUBSTRATES FOR OPTO-ELECTRONIC AND ELECTRONIC DEVICES

CROSS-REFERENCE TO RELATED APPLICATION

This is a continuation in part of U.S. patent application Ser. No. 09/524,062 filed on Mar. 13, 2000 pending in the names of Robert P. Vaudo, et al. for "III-V Nitride Substrate Boule and Method of Making and Using the Same."

BACKGROUND OF THE INVENTION

1. Field of the Invention

This invention relates to a method of achieving improved epitaxy quality of (Al,In,Ga)N films on corresponding free-standing substrates for fabrication of opto-electronic and electronic devices and device precursor structures.

2. Description of the Related Art (Al,In,Ga)N (which term as used herein refers inclusively and alternatively to each of individual nitrides containing one or more of Al, In and Ga, thereby alternatively encompassing each of AlN, $Al_xIn_{1-x}N$ (or AlInN), $Al_xGa_{1-x}N$ (or AlGaN), $Al_xIn_yGa_{1-x-y}N$ (or AlInGaN), InN, $In_yGa_{1-y}N$ (or InGaN) and GaN where $0 \leq x \leq 1$ and $0 \leq y \leq 1$, as well as mixtures thereof and doped layers (n-type or p-type) or remaining undoped) has been extensively studied with respect to its epitaxial layer growth on heavily lattice-mismatched substrates such as sapphire and SiC.

A primary reason for the pervasive character of such research is that free-standing (FS), coefficient of thermal expansion (CTE)—matched, and lattice-matched GaN substrates of suitable quality and size are unavailable.

Without homoepitaxial or native substrates, misfit dislocations will form due to lattice mismatch at the epitaxy-substrate interface, and cracking and bowing will occur due to the CTE mismatch, thereby limiting the quality of the epi and device layers. The epitaxial layer quality on these non-optimal substrates (e.g., sapphire or SiC) is of reasonable quality for simple electronic devices if complicated interlayer techniques are used.

Typically, to make higher quality devices, very difficult and complicated overgrowth techniques such as ELOG (epitaxial lateral overgrowth) or LEO (lateral epitaxial overgrowth) or Pendeo-epitaxy are employed, but the resulting material is non-uniform in morphology and crystalline quality. Further, the resulting material typically has a high carrier concentration due to impurity incorporation from the masking material. Such overgrowth techniques employ the use of a masking material such as $SiO_2$ to inhibit growth in certain areas on the substrate material. The epitaxial material then grows between the masked region and then laterally over the masking material, thereby reducing dislocation propagation in the laterally grown area.

The lack of a suitable quality lattice-matched (Al,In,Ga)N substrate has impeded (Al,In,Ga)N device developers from realizing the full potential of the (Al,In,Ga)N device capabilities and slowed the development of this material system. The complexity and difficulties attendant the lateral overgrowth techniques have prevented such approach from being satisfactorily commercially used.

A small amount of work has been done to produce nitride substrates and an even smaller amount of epitaxial layer growth has been done on the limited amount of GaN material produced.

As a background to discussion of the problems with GaN epilayer growth on FS GaN, techniques for producing free-standing GaN are described below. The ensuing discussion also highlights how the properties of some of the substrates have inhibited the development of a suitable epitaxial process.

Substrate Production

Potential methods for producing lattice matched or nearly lattice matched substrates superior to sapphire and SiC that have been developed to date include high pressure GaN crystal growth, AlN bulk growth, lithium aluminate (LAO), lithium gallate (LGO), thick (>100 micron) HVPE GaN and lift-off, and HVPE GaN boule growth, as discussed more fully below.

High Pressure Crystal Growth

High pressure crystal growth has been successful in producing small platelets (<20 mm diameter and <1–2 mm thick) of less than 300 square millimeters area of single crystal GaN but the GaN crystals have several problems. This technique produces small platelets and the scalability is difficult and the cost of the process is quite large compared to other alternatives. Further, dopant and conductivity control of the crystal is very difficult due to the technique. Another disadvantage is that high unintentional impurity levels are present in the crystal including oxygen, which make the substrates conductive. These high levels of impurities limit the frequency range of devices produced on the substrates due to parasitic capacitances between device layers and charge in the substrate and may inhibit epitaxy nucleation on the substrate at sufficiently high impurity concentrations.

AlN (or GaN) Substrate Formation via Sublimation and Re-condensation

The production of bulk AlN by sublimation and re-condensation technique is being performed to produce suitable, high quality, nearly lattice-matched (2.5% difference from GaN) substrates for GaN epitaxial growth. Currently, the boule diameter is limited to 13 millimeters, severely limiting the production of lost cost, high volume devices.

Another issue with these substrates is the extremely high oxygen level, on the order of parts per million (ppm), which will likely reduce the thermal conductivity of the substrates, making them less advantageous for high frequency, high power devices.

In addition to affecting the thermal conductivity, the high impurity incorporation in these substrates inhibits the production of controlled electrical conductivity type substrates, namely p-type substrates. These substrates are difficult to dope heavily by conventional techniques, making them less advantageous for vertical opto-electronic device structures. In the case of AlN substrates, the substrate and associated devices are disadvantaged by high ionization or activation energy of acceptors and donors in the crystal, as compared to GaN substrates.

Lithium Aluminate (LAO) and Lithium Gallate (LGO)

LAO and LGO are closely lattice-matched substrates (compared to SiC and sapphire) and are available in reasonable quality and size, however, several issues exist that prevent their applicability to the GaN material system. Most importantly, LAO and LGO materials suffer from low decomposition temperatures preventing them from being easily used for GaN growth at typical growth temperatures. Li and Ga desorption and diffusion from the substrate into the epitaxial film and growth environment make nucleation and high quality, impurity-free growth very difficult, thus limiting the applicability of this substrate. Limited process conditions are employed to grow on these substrates due to their high susceptibility to decomposition under $H_2$. Non-uniform polarity of the substrate surface is also an issue, typically causing mixed polarity domains in the GaN epitaxial film. The fabrication of vertical devices structures on such substrates also involves issues of doping and suppression of decomposition.

HVPE (Halide Vapor Phase Epitaxy) GaN Substrates via LILO (Laser Induced Lift-off) and HVPE GaN Based FS GaN Substrates via Boule Growth The HVPE GaN method is the most preferred method to date to produce FS GaN substrates. It enables large-area freestanding GaN wafers to be produced of high quality and low dislocation density, on which high quality, smooth epitaxial films and high quality devices can be fabricated. The process has the ability to be easily scaled to the desired size of the wafer, and substrate conductivity type can be readily controlled. Precursor and growth process set-up is relatively inexpensive compared to other techniques (e.g. high pressure crystal growth) and can be easily controlled with conventional process controls. Impurity incorporation is minimal and can be controlled through precursor purity and gas-phase ambient purity as well as reactor leak integrity and construction.

Homo-epitaxial Growth on High Quality FS HVPE GaN Substrates

Because there have been no large area, freestanding GaN wafers commercially and readily available, there has been limited opportunity to develop the conditions to produce high quality epitaxial layer growth on FS GaN.

As discussed hereinafter in greater detail, the present invention enables growth of epitaxial films of crystalline quality at least as good as that of the substrate, resolving novel issues associated with the growth of epitaxy on FS GaN and other (Al,In,Ga)N FS substrates, and provides substantially improved device performance with epitaxy and devices characteristics that are superior to those on other conventional substrates such as sapphire.

The following discussion highlights some of the problems associated with homoepitaxy on FS GaN substrates, including problems observed in our initial epitaxial growth studies, which have been resolved by the present invention.

1) Morphology Smoothing and Pit-filling

Initial studies on FS GaN "as grown" or unfinished substrates, shown in FIG. 1, using conditions for growth on sapphire, did not yield smooth epitaxial films after 2–3 microns of growth (see FIG. 2). It was determined that increased thickness of epi was required to make an improvement in the smoothing and pit filling of the surface morphology with standard growth conditions (as used for epi growth on sapphire or SiC substrates). A significant issue relating to growth on FS GaN "as grown" or unfinished surfaces is that appreciable MOVPE (Metal Organic Vapor Phase Epitaxy) thickness has to be deposited to smooth out hillock morphology from the HVPE GaN. This is demonstrated in FIGS. 1–3.

Even at 7.5 $\mu$m of deposited epi, the film is still somewhat rough for MOVPE based device structures, as shown in FIG. 3. Pits in the substrate surface do not fill in readily under standard growth conditions and require extended growth times involving several microns of film growth to begin "smooth-out" of the surface. Growing thicker layers of epitaxy on the FS GaN substrate smooths out the "as grown" or unfinished FS GaN morphology, but at the expense of increased cost and longer growth time for a device structure, which in turn increases the cost of the device structure growth and reduces the throughput and profitability of the vapor phase epitaxy (VPE) reactor operation.

2) Polishing Issues on FS GaN Substrates

As is the case with many other hard, brittle semiconductor crystals, such as SiC, polishing the GaN wafers prior to epitaxial growth surface is not trivial. Initial experiments involving polishing of FS GaN and subsequent MOVPE GaN growth revealed the occurrence of polishing scratches and poorly prepared surface using first cut conditions for polishing, shown in FIG. 4.

FIG. 5 shows the polishing induced damage in a 2.5 micron GaN epitaxial film grown on the substrate. There is reduced coherent growth and coalescence decorating what appears to be polishing damage or scratches.

Some smoother growth is revealed at higher magnification (255×) in FIG. 6, in areas where the 2.5 microns GaN epitaxial thin film grew, indicating that the film is attempting to grow in a two-dimensional fashion, replicating the underlying GaN substrate material.

3) FS GaN Backside Evaporative Products

Another issue related to homoepitaxial growth on FS GaN substrates is that the backside of the GaN wafer (N-face) tends to decompose during growth. This decomposition tends to interrupt the epi growth surface. Decomposition products escaping from the backside of the wafer are transported to the growth area disturbing the growth conditions and causing interrupted morphology.

FIG. 7 shows the normal morphology of a GaN PIN/10 $\mu$m GaN epi on FS GaN, while FIG. 8 shows the morphology degradation of an area where backside evaporative has inhibited the epitaxial layer growth. It is to be noted, however, that the backside evaporative product does not necessarily need to reach the epi surface in order to degrade the morphology, since the degradation product trapped between the susceptor and substrate material may modify the nature and extent of thermal contact, thereby introducing changes that may degrade the morphological uniformity of temperature-sensitive epitaxial layers and device structures.

The backside decomposition also changes the surface chemistry and therefore the nature of the electrical contacts formed on the backside of the gallium nitride substrate.

4) X-ray FWHM Increase with DCXRD Slit Width

Another issue related to GaN substrates and epi thereon is the increase in GaN epi FWHM with increasing x-ray slit size, as shown in FIG. 9.

The DCXRD FWHM of the substrates increases with increasing x-ray slit width but at a lower rate than the 10 $\mu$m epitaxial layer and device structure thereon. This increased FWHM at larger slit width is attributed to bowing due to backside substrate evaporation, a thermal stress-related issue, epi tilt, and crystalline domains in the substrate. At smaller slit width the "as grown" FS GaN substrate and epitaxial layer have similar DCXRD FWHM.

5) Morphology Interruption in Epitaxial Films

The substrate preparation, interface preparation upon heat-up and substrate cleaning, also create issues in MOVPE GaN growth on FS GaN substrates. General reactor conditions may also affect epitaxial morphology for growth on FS GaN, resulting in poor interrupted morphologies. Proper coating on the susceptor and cleaning of the reactor parts are necessary to reduce contamination at the substrate epi interface. With other substrates such as sapphire and SiC, the cleanliness of the epitaxial growth system is less of an issue due to the highly defective interlayers that conventionally are grown on such substrates to reduce the lattice mis-match and strain between epi layer and substrate.

6) Contamination and Charge at Substrate-epi Interface

Contamination at the homoepitaxial interface is defined here as any unintentional impurity defect or other flaw within 1000 Angstroms of the homoepitaxial epi and substrate interface and which has a concentration two times greater than the substrate or epi layer at a distance greater than 1000 Angstroms from the interface.

Potential impurity and structural damage at the interface leading to charge accumulation at the substrate-epi interface is a potential issue for the use of FS (Al, Ga, In)N in high frequency electronic devices. The homoepitaxial substrate— epi interface has substantial impurity concentrations deriving from cleaning, substrate preparation and reactor preparation conditions. High impurity concentrations (of species such as Si, O, C, S, etc.) at densities similar to those that might be found at epi-substrate interfaces usually result in interrupted epitaxial morphology unsuitable for epi device fabrication and production of high quality devices. FIG. 10 shows that Si=3E18 cm$^{-3}$ and O=3.5E18 cm$^{-3}$ at the interface with a S increase at the interface (1E16 cm$^{-3}$).

All of the issues pertaining to contamination and charge at the substrate-epi interface (i.e. those discussed in Section 6) were identified from epitaxial growth on HVPE GaN substrate materials with the 10 micron HVPE GaN/sapphire structure, and have been demonstrated empirically. Further, these issues more generally affect all free-standing GaN and lattice-matched substrate generation and while specifically described hereafter with specific reference to HVPE GaN substrates, the resolution of such issues by the method of the present invention as hereinafter described is applicable to all FS GaN ((Al,In,Ga)N) or lattice-matched substrate generation.

Thus, initial investigations into the growth of GaN epitaxy on HVPE FS GaN (both "as grown" or unfinished and as polished or finished subsequent to growth formation) raise a number of questions, as set out below.

(1) Given the unavailability of GaN substrates, how can GaN of high crystalline quality (i.e. suitable for devices) be produced?

(2) How can high performance dislocation (low density) and improved material quality (smoothness, impurity level)-sensitive optoelectronic and electronic devices, e.g., ultraviolet light emitting diodes(UV LEDs), ultra-high-brightness blue LEDs, HEMTs (high electron mobility transistors), LDs (laser diodes) or PIN photovoltaic detectors be produced on FS GaN in a commercially reliable and reproducible manner?

(3) How can the GaN substrate be finished (e.g., by etch, polish, further processing, etc.) to yield good epitaxy?

(4) How can backside evaporation (or, more generally, evaporative products on (from) the backside of the wafer) during growth be inhibited?

(5) Is growth of epitaxy for devices on unpolished, FS GaN feasible?

(6) How can the as-grown or unfinished GaN surface be smoothed?

(7) How can the GaN substrate surface be smoothed most efficiently and cost-effectively to allow FS GaN substrates to be a preferred substrate of choice for all GaN epitaxial applications?

(8) What are optimal substrate cleaning conditions, heating conditions and reactor preparation conditions for producing good epitaxy on FS GaN?

(9) How can the HVPE substrate be cleaned to produce a surface suitable for epitaxial growth?

(10) What crystallographic orientation yields the best epitaxy for devices and what are the growth conditions to produce this epitaxy?

(11) How can potential tilt, mis-oriented crystal grains, inversion domains and other crystallographic defects be overcome to achieve high quality epitaxial growth on FS GaN?

(12) How can substrate-epi interface contamination and unintentional charge build up (n or p) be avoided, eliminated, or negated (to produce no resultant unintentional charge)?

(13) How can the GaN substrate material and high quality strain-free epi thereon enable novel device structures deemed less desirable on other substrates?

The art has not satisfactorily resolved these issues, which are addressed by the present invention.

SUMMARY OF THE INVENTION

The present invention relates to III-V nitride homoepitaxial materials of superior low defect density and surface texture characteristics, and to methods of making the same.

As used herein, the term "homoepitaxial" in reference to a material, structure or device means that in such material, structure or device an (Al,In,Ga)N layer is deposited on an (Al,In,Ga)N substrate. Accordingly, consistent with the broad definition of (Al,In,Ga)N, such homoepitaxial material, structure or device can comprise an AlN layer on a GaN substrate, an InN on aAl$_x$Ga$_{1-x}$N (where $0\leq x\leq 1$) substrate, an Al$_x$In$_y$Ga$_{1-x-y}$N (where $0\leq x\leq 1$ and $0\leq y\leq 1$) layer on an InN substrate, etc. Thus, such homoepitaxial material, structure or device is homoepitaxial with respect to the (Al,In,Ga)N group of individual compounds.

As used herein, the term "III-V Nitride" refers to a Group III-V compound semiconductor material including nitrogen.

As used herein, the term "unfinished substrate" means an (Al,In,Ga)N material as grown by seed or nucleation process, and optionally subdivided (e.g., by fracture cleavage, wire saw cutting into wafer form or the like) and/or subjected (in bulk or subdivided form) to cleaning not involving removal of (Al,In,Ga)N in the cleaning process.

As used herein, the term "finished substrate" means an unfinished substrate that has been subjected to further processing (in bulk or subdivided form) involving removal of (Al,In,Ga)N, e.g., by lapping, diamond polishing, etching, chemical mechanical polishing, surface morphological modification, surface defect modification, ion sputtering, surface aberration reduction or removal, pit-filling, mechanical abrading, or the like.

As used herein, the term "low pressure" in reference to a deposition process means a pressure in the process environment of from about 50 to about 500 torr. "Low pressure heat-up conditions" have preferred nitrogen partial pressures in the range of from about 1 torr to about 500 torr, and more preferably from about 10 to about 400 torr.

As used herein, the term "atmospheric pressure" in reference to a deposition process means a pressure in the process environment of from about 500 to about 1000 torr. Low pressure and atmospheric pressure deposition processes for (Al,In,Ga)N deposition typically differ only in the nitrogen partial pressure in the process environment. "Atmospheric pressure heat-up conditions" have preferred nitrogen partial pressures in the range of from about 1 torr to about 1000 torr, and more preferably from about 100 to about 800 torr.

As used herein, the term "high pressure" in reference to a deposition process means a pressure in the process environment above about 1000 torr.

In ensuing description herein, reference is made in various instances to GaN substrates and GaN epi, as generally representative for (Al,Ga,In)N substrates and (Al,In,Ga)N epi, respectively.

The deposition processing conditions for homoepitaxial deposition of epi on a substrate are discussed herein primarily in reference to metalorganic vapor phase epitaxy (MOVPE) processes, but the invention broadly contemplates other methods for the formation of epitaxial films of (Al,In,Ga)N on a substrate, including other forms of vapor phase epitaxy such as hydride vapor phase epitaxy (HVPE), molecular beam epitaxy (MBE), sputtering deposition processes, etc.

In one aspect, the invention relates to a method of forming a III-V nitride homoepitaxial layer on a corresponding III-V nitride material substrate with quality comparable to that described in our earlier copending U.S. patent application Ser. No. 09/524,062 filed on Mar. 13, 2000 in the names of Robert P. Vaudo, et al. for "III-V Nitride Substrate Boule and Method of Making and Using the Same," the disclosure of which hereby is incorporated herein by reference in its entirety.

In such method, the III-V nitride homoepitaxial layer is deposited by a VPE process using Group III source material and nitrogen source material under process conditions including V/III ratio (Group V flux/Group III flux) in a range of from about 1 to about $10^5$, nitrogen source material partial pressure in a range of from about 1 to about $10^3$ torr, growth temperature in a range of from about 900 to about 1250 degrees Celsius for GaN, growth temperature in a range of from about 500 to about 1000 degrees Celsius for InGaN, growth temperature in a range of from about 1100 to about 1250 degrees Celsius for AlGaN, growth temperature in a range of from about 600 to about 1250 degrees Celsius for AlInGaN, and growth rate in a range of from about 0.1 to about 500 microns per hour.

In another aspect, the invention relates to an epitaxial layer that replicates or improves the material quality of the III-V nitride substrate producing a dislocation density of less than 5E8 dislocations per square centimeter and a DCXRD FWHM of less than 200 arcsecs.

In another aspect, the invention relates to an epitaxial layer on III-V nitride substrate system which has a sheet resistance of greater than $10^4$ ohms per square centimeter at room temperature or more preferred greater than $10^5$ ohms per square centimeter, and to a method of making the same.

In another aspect, the invention relates to an epitaxial layer and growth sequence that reduces morphology and defect disparities in unfinished or finished FS GaN and a method of making the same.

In another aspect, the invention relates to a method of forming a III-V nitride homoepitaxial layer on a corresponding III-V nitride material substrate, comprising depositing the III-V nitride homoepitaxial layer by a VPE process using Group III source material and nitrogen source material, wherein the substrate is reposed on a susceptor surface during such depositing step. Such method in one embodiment further comprises coating the susceptor surface with a corresponding III-V nitride material prior to reposing the substrate thereon for the depositing step, and/or preparing the susceptor and reactor parts with a less volatile and inert coating such as metal carbide (TaC, NbC, etc.).

A further aspect of the invention relates to III-V nitride homoepitaxial materials and structures variously made by the above-described methods.

In yet another aspect, the invention relates to a III-V nitride homoepitaxial microelectronic device structure comprising a III-V nitride homoepitaxial epi layer on a FS III-V nitride material substrate.

Additional aspects of the invention relate include, without limitation: tilt reduction between crystal grains propagated from the substrate; cleaning of wafers to remove impurities; heat-up conditions on substrates that enhance epi material quality; growth conditions on various orientations that yield preferred epi layers; epi in general on alternative crystallographic planes other than c-planes; protecting the backside of the substrate from evaporation to prevent epitaxial interruption; interlayers between substrate and epi; strain relief layers; pauses in dopant flow in nucleation and nucleating schemes; methods of smoothing; finishing and growth on finished FS GaN; surfactant addition to change growth mechanisms; and methods to facilitate smoothing of unfinished and finished FS GaN.

Other aspects, features and embodiments of the invention will be more fully apparent from the ensuing disclosure and appended claims.

DETAILED DESCRIPTION OF THE INVENTION, AND PREFERRED EMBODIMENTS THEREOF

Figure 1:
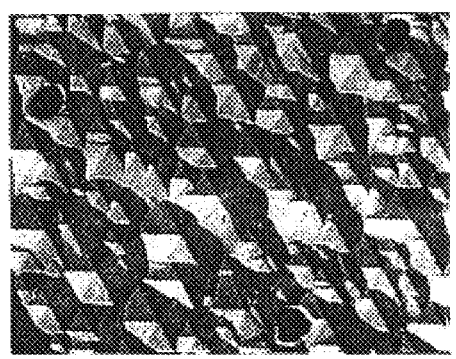
FIG. 1 is a photomicrograph of a FS GaN wafer at 130× magnification.
Figure 2:
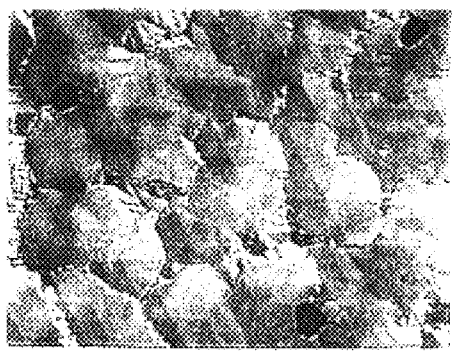
FIG. 2 shows a 2.5 micron GaN MOVPE film formed on a piece of the FS GaN substrate of FIG. 1, at a magnification of 130×.
Figure 3:
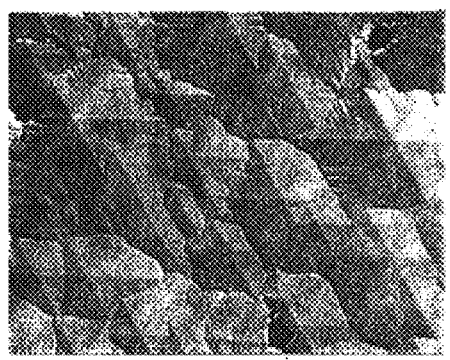
FIG. 3 shows a 7.5 micron GaN MOVPE film on a piece of the FS GaN substrate of FIG. 1, at a magnification of 130×.
Figure 4:
FIG. 4 is a micrograph at 65× magnification, showing a polished FS GaN substrate.
Figure 5:
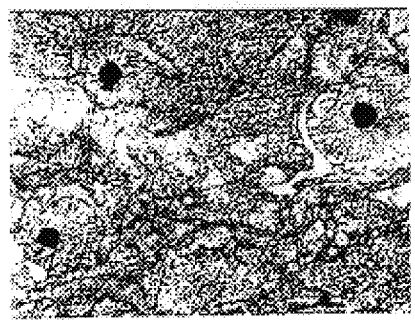
FIG. 5, at a magnification of 65×, shows the effect of polishing induced damage in a 2.5 micron thick GaN epitaxial film grown on the substrate of FIG. 4.
Figure 6:
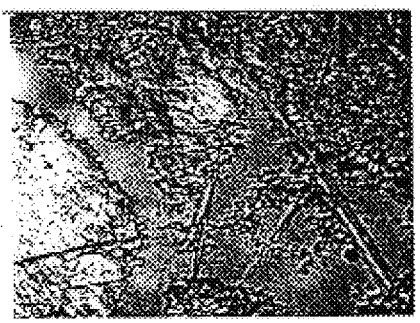
FIG. 6 is an enlarged view, at a magnification of 255×, of the GaN film of FIG. 5.
Figure 7:
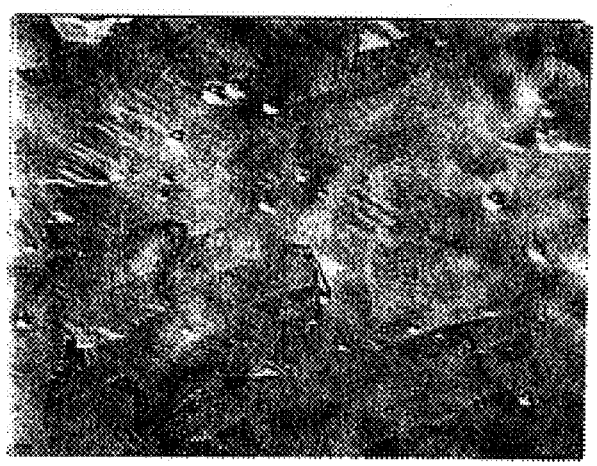
FIG. 7 is a micrograph, at a magnification of 65×, of a GaN PIN/10 microns GaN epi on FS GaN, showing morphology.
Figure 8:
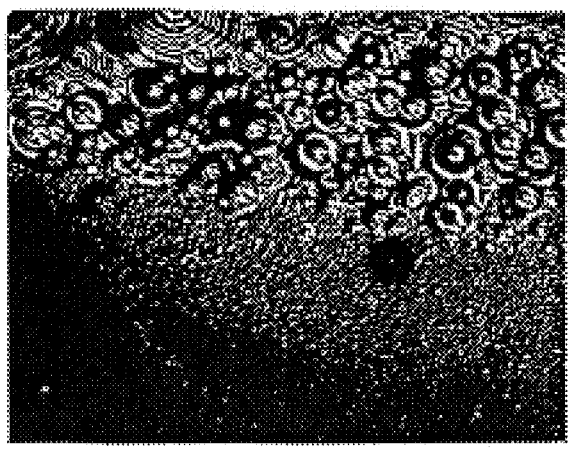
FIG. 8 is a micrograph at a magnification of 65×, of an area on the growth surface of epi layer in FIG. 7 where backside evaporative product reached the epi.
Figure 9:
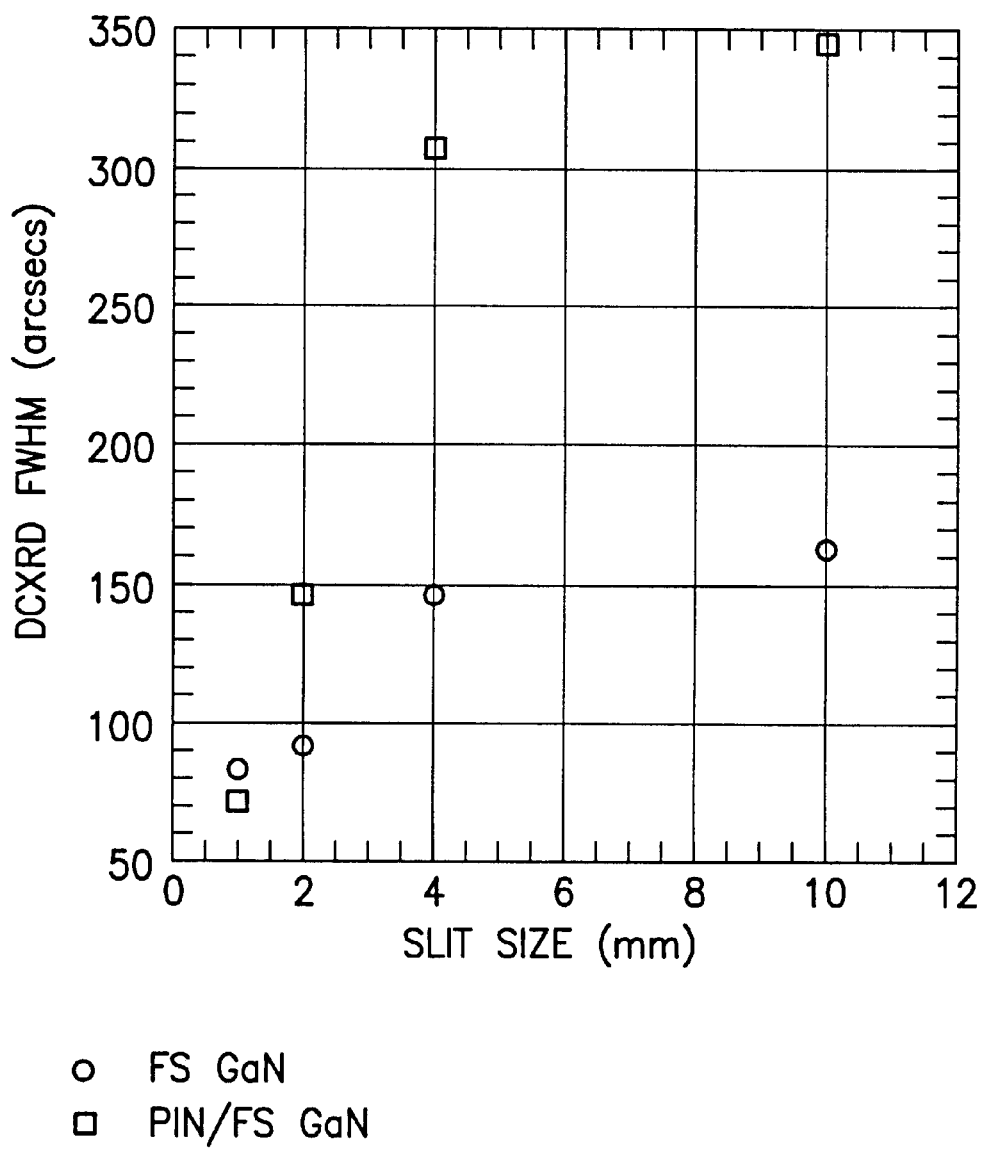
FIG. 9 is a graph of DCXRD FWHM as a function of increasing slit width for unfinished HVPE GaN substrates and 10 micron epi layer plus device structure thereon.

The disclosures of the following United States Patents and United States Patent Applications are hereby incorporated herein by reference in their respective entireties:

U.S. patent application Ser. No. 08/188,469 filed Jan. 27, 1994 in the names of Michael A. Tischler, et al., now issued as U.S. Pat. No. 5,679,152;

U.S. patent application Ser. No. 08/955,168 filed Oct. 21, 1997 in the names of Michael A. Tischler, et al.;

U.S. patent application Ser. No. 08/984,473 filed Dec. 3, 1997 in the names of Robert P. Vaudo, et al.;

U.S. patent application Ser. No. 09/179,049 filed Oct. 26, 1998 in the names of Robert P. Vaudo, et al.;

U.S. patent application Ser. No. 09/524,062 filed on Mar. 13, 2000 in the names of Robert P. Vaudo, et al.; and U.S. patent application Ser. No. 09/339,510 filed on Jun. 24, 1999 in the names of Barbara A. Landini, et al. for "SILICON CARBIDE EPITAXIAL LAYERS GROWN ON SUBSTRATES OFFCUT TOWARDS <1$\bar{1}$00>."

As used herein, the term "free-standing" or "FS" in reference to a substrate of (Al,In,Ga)N or other III-V nitride material means that such substrate is a self-supporting structure, e.g., of wafer or plate form.

The identification of proper growth conditions or growth condition parameters enables growth of high quality epitaxy and the fabrication of high performance devices on FS GaN. The growth condition parameters overlap the ranges used for growth on other substrates, but the optimal conditions for growth differ from those used to grow on sapphire or SiC.

The invention is additionally described hereinafter with reference to various specific aspects and features of the methodology and techniques of the invention.

The cleaning methods to remove surface contamination from the FS GaN substrates which results from unfinished or finished (polishing, liftoff, etc) processing of the FS GaN wafer are first described.

Cleaning the unfinished HVPE GaN surface. Aqueous acid (HCl, HNO$_3$, etc.) and base cleaning (NH$_4$OH, KOH, etc.) methods for FS GaN substrates are employed that are different from those used in the cleaning of other homoepitaxial GaN substrates. These different methods derive from the process differences involved in the formation of the GaN substrates, e.g., HVPE GaN based substrates typically will have reactor deposition products, namely NH$_4$Cl, on the wafer surface, deposited during wafer unload, which is required to be removed to achieve high quality homo-epitaxial growth. HCl is used to remove elemental GaN from the substrate surface.

Cleaning the finished HVPE GaN surface. Oxidation of FS finished GaN substrates followed by a strip (KOH, NH$_4$OH, HCl, HF, etc.) just prior to growth is employed to achieve impurity reduction or removal of impurities near the epitaxial surface, as to which room temperature cleaning is deficient. Defective wafers are identified by defect regions (pits, scratches, subsurface damage) and such defects are removed by oxidation or the wafer is subjected to re-working. In one embodiment, oxidation is usefully employed to preferentially and/or completely decorate higher surface energy areas.

Removing structural disparities in the HVPE grown surface. The oxidation of the FS GaN surface is employed to preferentially oxidize the hillocks on the surface due to their greater surface energy and different crystal facets, so that the oxide is stripped to create a more smooth surface or a reduced aspect ratio of the hex hillocks. This technique may also be used to eliminate disparities in the surface resulting from device processing, e.g. to remove rough surfaces (grassing) resulting from micro masking in a reactive ion etching (RIE) step. Repeated treatments of oxide and strip may be employed for the best results.

RIE cleaning to protect fragile wafer. RIE in some embodiments is a preferred method of cleaning the FS GaN substrate. RIE enables removal of stubborn surface contaminants from finishing or handling, including some embedded finishing media or other contaminant material from processing, in instances where techniques such as aggressive ultrasonic cleaning may cause the wafer to break or fracture due to its fragility.

Pre-epitaxial Growth Treatments
Heat-up Conditions for FS GaN Substrates

Heat-up enables not only the achievement of the growth temperature, but can advantageously facilitate the occurrence of: 1) smoothing of the substrate surface, 2) removal of damage of the substrate surface, 3) removal of contaminants at the epitaxial substrate surface resulting from processing, 4) reduction of defect propagation at the interface (growth over small pits or dislocations), 5) elimination or reduction of new defect formation (such as vacancies, dislocations, inversion domains, etc.) at the interface, 6) reduction of electrically active dislocations (i.e., H passivates certain types of dislocations), and 7) reduction or modification of substrate impurity out-gassing (e.g., from sulfur in the substrate material, oxygen at the backside of the wafer, etc.). The art has not addressed the use of heat-up conditions and techniques to achieve these advantages in growth on GaN to produce homoepitaxial interfaces.

Coating of susceptor to prevent contamination during heat-up. Susceptor-based contamination is suppressed by coating the susceptor with epi deposition before growth on the FS GaN substrate. Morphology is improved as a result. Impurity reduction of the GaN epi-GaN substrate interface is readily verifiable via SIMS techniques and can be employed for process characterization (e.g., at the GaN epi-HVPE GaN interface, O<3E18 cm$^{-3}$, Si<3E18 cm$^{-3}$ and S<5E16 cm$^{-3}$ concentrations are readily achievable, which enable high quality homo-epitaxial layers). Preferred metal carbide coatings include those that are more inert than SiC coating or SiC:N coatings, such as TaC or NbC, to reduce the possibility of contamination during heat-up.

Heat-up conditions. Preferred heat-up conditions and associated process parameters include nitrogen species (NH$_3$, Amines, N$_2$, etc.) at partial pressures in the range of from about 1 torr to about 1000 torr, a ramp time of from about 1 minute to about 1000 minutes, temperature ramp rates in the range of from about 10° C. per minute to about 1000° C. per minute, and the use of an ambient including species such as H$_2$, N$_2$, Ar, He, Ne, and HCl, and mixtures of two or more of the foregoing.

In one illustrative embodiment, particularly preferred heat-up conditions for low pressure deposition and associated process parameters include nitrogen species (amines, N$_2$, etc) partial pressures in the range of from about 10 torr to about 400 torr, a ramp time in the range of from about 1 minute to about 100 minutes, temperature ramp rates in the range of from about 100° C. per minute to about 400° C. per minute, and the use of an ambient including species such as H$_2$, N$_2$, Ar, He, Ne, and HCl, and mixtures thereof.

It will be appreciated that optimal heat-up conditions are substantially different for high quality homoepitaxial growth on HVPE GaN FS GaN substrates than those used for growth of 10 micron HVPE GaN/sapphire, or GaN on sapphire, or GaN on SiC interlayers. It will also be appreciated that optimal heat-up conditions may be dependent on the starting and desired end point conditions of the FS GaN wafer with epitaxial film thereon.

It will also be recognized that a variety of different types of deposition processes are usefully employed in the broad practice of the invention, including low pressure, atmospheric pressure processes and high pressure processes, or in processes for multi wafer or single wafer systems, and that the specific preferred and optimal process conditions will correspondingly vary, but are determinable by those of skill in the art based on the disclosure herein, without undue experimentation.

Change of ambient gases to facilitate surface preparation. Controlled ambient environment is employed to facilitate impurity removal or removal of defective surface material, and to maintain uniformity of substrate temperature and temperature of the growth template. The ambient advantageously comprises any suitable gas(es), either single component or multicomponent, including by way of example Ar, N$_2$, H$_2$, HCl, He, Ne, etc. and any combination of two or more species thereof.

Addition of impurities during heat-up. Addition of impurities during heat-up enables the compensation of charge at the interface to allow highly resistive epitaxial layer substrate interfaces. Using these charge-compensated structures, high frequency devices can be grown and fabricated thereon, taking advantage of the compensation for surface defects to overcome charge non-homogeneity at the surface.

Epi on Various Crystallographic Planes

Epi on FS HVPE GaN The growth of epi on FS GaN substrates in accordance with the present invention is unique, and the prior art has not provided FS GaN substrates for such epitaxial growth.

Differing crystal orientations will yield different results. Crystallographic orientation can affect growth mechanism, morphology, crystalline quality, film stoichiometry, intentional and unintentional impurity incorporation, strain, carrier transport, optical properties, finishing, RIE and other device fabrication characteristics. AFM studies evidence no significant step bunching or other epitaxial flaw in epi on differing crystal orientations or facets of the GaN substrate.

Vicinal surface growth. Off-cuts from (0001) as well as other crystallographic orientation growth are readily achieved. AFM studies also evidence no significant step bunching in varied off-cuts.

Off-cuts from the primary crystal orientation (0001). Off cut direction, as for example <11$\overline{2}$0> or <10 $\overline{1}$0>, or therebetween, can be employed. For crystal orientations other than (0001), different offcut directions are preferred in various embodiments.

Ga and N face growth. Different growth polarity faces can be employed to correspondingly vary growth mechanism, morphology, crystalline quality, film stoichiometry, intentional and unintentional impurity incorporation, strain, carrier transport, optical properties, finishing, RIE and other device fabrication effects.

Epi Growth Conditions

Epi growth conditions can be selectively varied to correspondingly change epitaxial quality and surface morphology. In this respect, it is to be appreciated that growing on FS HVPE GaN will effect a reduction in impurity incorporation compared to other substrate materials such as LiGaO, LiAlO, SiC, sapphire, etc.

Growth conditions are readily optimized to smooth the unfinished HVPE GaN surface. Growth conditions including V/III, PNH$_3$ (Partial Pressure of NH$_3$), T (temperature in degrees Celsius), GR (growth rate in microns per hour) of epitaxial material are selected to effect smoothing of bulk hex mound-like textures and filling of inverted-hex pits (higher V/III and reactor pressure). In the following discussion, we will discuss growth rate, which is primarily dependent on gas flows for a given reactor, temperature and pressure. In our vertical geometry research reactor (10 cm diameter), for example to achieve a GaN growth rate of approximately two microns per hour at a growth temperature of 1100° Celsius we utilize flows of approximately 40 to 50 sccm H$_2$ through the TMG bubbler (TMG bubbler temperature –10° Celsius and bubbler pressure equal to 760 torr) and NH$_3$ flows of approximately 2.0 to 2.4 slm in a hydrogen carrier gas flow 10 to 12 slm at a reactor pressure of 100 torr. It is recognized that one skilled in the art could utilize these conditions and the information provided in this disclosure to grow a wide variety of epitaxial AlInGaN films without undo experimentation. This smoothing ability is an unexpected advantage to growth on FS GaN. Preferred growth conditions ranges include V/III ratio from 1 to 100,000, NH$_3$ partial pressures in the range of from bout 1 torr to about 500 torr, growth temperature in the range of from about 500° C. to about 1250° C. and growth rates from about 0.1 µm/hr to about 500 µm/hr. Most preferred growth conditions include V/III ratio from about 10 to about 50,000, NH$_3$ partial pressures of from about 20 torr to about 400 torr, growth temperature from about 1000° C. to about 1150° C. and growth rates from about 0.5 µm/hr to about 10 µm/hr, for low pressure GaN MOVPE.

It will be recognized that atmospheric pressure conditions are correspondingly readily determinable, and that such conditions are readily specified for preferred and optimal operation.

While the foregoing discussion is directed to MOVPE, it will be recognized that other process techniques, e.g., MBE, sputtering, etc., are readily utilized, with other and correspondingly modified process conditions being readily determinable therefrom.

Dislocation reduction Modification-manipulation of growth conditions is usefully applied to effect dislocation reduction.

Tilt reduction Orientation selection and modification of growth conditions are readily selectively applied to achieve crystallographic epitaxial tilt reduction between grains or domains in FS GaN substrates.

Step flow and macro step formation Growth conditions can be chosen to selectively achieve desired step flow growth, degree of step bunching, etc.

Surface definition for epitaxy growth. RIE conditions can be adjusted to preferentially expose surfaces, and certain surface exposures can be selected as the growth surface. Corresponding adjustment can be made with a wet etch that is surface selective.

Impurity addition Impurity addition to growth is utilized for enhanced smoothing or to control polytype fixing. Various impurities (n-dopants, p-dopants, etc) can be added to adjust the electrical properties and alter the surface morphology compared to the undoped (Al,In,Ga)N film. Impurities can be added to maintain polytype and crystallographic structures during the growth of the epi on the substrate. Surfactants can be added to preferentially grow or smooth certain areas of the substrate surface.

Growth conditions not static. Multiple stage smoothing processing for FS GaN homo-epitaxial films is beneficially employed in specific applications of the invention. For example, a first set of conditions can be utilized to smooth, reduce dislocation density defect generation, reduce tilt, etc., and a second set of conditions then can be usefully employed to form epitaxial layer(s) for electronics or opto-electronic device structure(s).

RIE to selectively remove impurities before growth. RIE is usefully employed in various embodiments of the invention to clean the surface of chemical impurities, prior to epitaxial growth.

Substrate Backside Evaporative Protection

Substrate backside evaporative protection is an issue, as previously described. Interrupted morphology from backside evaporation product results at higher growth temperatures.

Temperature ranges in instances where substrate backside evaporative protection is needed. Preferred temperature for which substrate backside evaporative protection is desired is in the range of from about 900 to about 1200° C., with most preferred temperature being in the range of from about 1000 to about 1200° C., and further preferred temperature being >1050° C. In the case of In containing substrates, the preferred temperature for which substrate backside protection is desired is >500° C.

Materials that protect backside from evaporation. Advantageous materials for such purpose are usefully identified as having appropriate characteristics, e.g., CTE match to the substrate, adherence to the substrate, not out-gassing, having low vapor pressure, having high thermal conductivity, non-melting at growth temperature, optically reflective or optically transparent, electrically conductive, having specific and controlled conductivity type, inertness, having specific directional conductivity (i.e. lateral or vertical), having engineered narrow reflectivity bands, etc. Suitable materials, e.g., SiN, SiO$_2$, (Al,In,Ga)N, Pd, Ti, Si, Ru, Tu, dielectric stack material, Pt, semiconductor oxides, etc., are readily empirically determinable without undue experimentation, with respect to determining CTE, out-gassing, vapor pressure, thermal conductivity, electrical conductivity and other characteristics of specific materials.

Materials that protect backside and are n or p-type ohmics. Advantageous materials for such purpose include materials described in the preceding paragraph, but also can be an ohmic contact to the wafer.

Materials that offer structural support for thin FS GaN substrates. These are materials of the types described in the two preceding paragraphs. The materials may be chosen to offer support (temporarily or non-temporarily) and to be easily removable to facilitate device fabrication (e.g., by laser facet cleaving).

Multiple layer of materials. These include the materials in the last three paragraphs. For example, a first layer may provide ohmic contact to the GaN layer and a second layer may be suitable for establishing electrical contact to the ohmic contact and for wire bonding.

Materials that are not inert to growth environment but can coated with an inert material to be removed later. These materials include those identified in the preceding paragraph.

Modification of surface energy of backside wafer. This involves the removal of high surface energy material from the backside, e.g., by finishing, to reduce the potential of the backside material to evaporate. Finishing of the backside of the wafer with a different orientation to prevent backside evaporation is also useful in various embodiments of the invention. Chemically reacting or alloying the backside of the wafer to make it more inert at higher temperature or to reduce the surface energy is another embodiment of such surface energy modification approach. For example, the back side of (Al,In,Ga)N substrate in one embodiment is oxidized. Other processing steps are useful to passivate or modify the surface in a corresponding manner.

Materials that reduce the bow of the wafer. These materials are more fully described hereinafter, and function to bend the wafer back to a more planar wafer conformation, thereby reducing bow of the wafer and improving thermal contact with the susceptor.

Materials that improve thermal contact between the susceptor and substrate. These materials may include those mentioned in preceding paragraph, that function to deform upon heat-up, and fill in gaps between susceptor and substrate, or otherwise react with the environment to fill in gaps between susceptor and substrate. In general, such materials have high thermal conductivity and enable good and uniform thermal contact between substrate and susceptor. Any suitable material may be used for this purpose, including deformable materials that deform to compensate for surface disparities on either or both of the facing surfaces of the substrate and susceptor.

Reactor design to eliminate backside evaporation. The reactor design can be adapted for this purpose, in a variety of manners. For example, $NH_3$ can be flowed behind the wafer or the reactor can be designed in a manner effective to purge the interior volume of the reactor to dilute the evaporating product.

Low T (Al,In,Ga)N Interlayers on FS (Al,In,Ga)N

Surface morphology improvement. Low temperature (Al, In,Ga)N growth followed by re-crystallization is usefully employed in various embodiments of the invention to improve smoothing efficiency (hex hillocks and inverted hex pits), and achieve quicker smoothing time (i.e., less growth time and precursor usage).

Correction of uniform or non-uniform crystalline orientation and polarity defects. This refers to aspects of the invention that achieve reduction in tilt of grains, mosaicity or inversion domain non-uniformity on the substrate.

Reduction of dislocations. This refers to aspects of the invention that reduce dislocations more quickly, reduce certain types of dislocations, and improve material quality.

Strain Relief Interlayer

Epi interlayer to relieve strain in FS (Al,In,Ga)N. FS (Al,In,Ga)N as produced or supplied can have residual strain, different lattice-matched or mismatched character. (Al,In,Ga)N compounds can be employed in epitaxial layers to counteract strain propagation into the epitaxial device structure. High temperature anneals can be employed to reduce the strain, as described more fully hereinafter.

Other Interlayers (Al, In, Ga)N interlayers deposited between the FS (Al, In, Ga)N substrate and the epitaxial layer (the epitaxial layer optionally having device structure thereon) may be employed to accomplish improvements in epilayer or device characteristics. These interlayers may be graded in homoepitaxial composition, doping and non-homoepitaxial composition (graded with other material such as SiC, BN, etc). Superlattices (one or more layers) may be employed to achieve, for example, dislocations bending.

Pause in Dopant for Nucleation on FS (Al,In,Ga)N

Thickness of film. A film thickness of undoped GaN epi of less than 1500 Angstroms is necessary to eliminate interrupted morphology in the epi growth and allow initial high quality nucleation of GaN on FS GaN substrates. A more preferred GaN undoped epi thickness would be sufficiently low to allow electron or hole transport across the undoped layer. Corresponding considerations apply to other (Al,In,Ga)N materials.

N-type dopants. Silane, disilane, germane, oxygen, sulfur, etc. are usefully employed for forming corresponding N-type epi films.

P-type. $Cp_2Mg$ (solid and liquid, wherein Cp is biscyclopentadienyl), diethylberyllium, zinc, Ca, etc. are usefully employed for forming corresponding P-type epi films.

Mass Transport for Improved Smoothing of Morphology

Mass Transport Method 1. This relates to the selection of a particular ambient to smooth out the FS GaN surface using FS GaN material high surface energy regions. $NH_3$ and $H_2$ ambients or $H_2$ ambients are usefully employed for such purpose.

Mass Transport Method 2. Due to impurities in the substrate during mass transport, dilution before or during mass transport can advantageously be used to smooth morphology. Addition of III-V nitride growth precursors can change the way the smoothing occurs and modify mass transfer driving force or mechanism.

Mass Transport Method 3. Methods 1) and 2) can be employed with the use of a surfactant to enable smoothing to be effected more readily.

Ambient control in Methods 1, 2 or 3. Ambient can be controlled to facilitate one or more of the preceding Methods in series.

Growth on Finished Substrate

In-situ finish damage removal or reduction: etch-back of substrate material followed by growth: and RIE etch or KOH etch prior to growth. These techniques are advantageously employed in various embodiments of the invention to effect growth on the finished substrate.

Selective Mask of Defects for Defect Overgrowth and Elimination

Electrolytic mask. This approach involves selectively depositing mask material, taking advantage of the electrically active nature of dislocations and defects in the substrate, where the mask material preferentially deposits in areas of electrical activity (i.e., dislocations, defects). Additionally, certain crystallographic facets in unfinished FS (Al,In,Ga)N may have differing electrical activity to allow deposit of the mask selectively on preferred FS (Al,In,Ga)N crystal facets or morphologies. A blanket masking-layer deposition followed by selective removal mitigated by the electrically active defects may also be employed.

Selective oxide in pits or dislocations. This involves selective or preferential oxidation or a mask in pits or dislocations having different surface energy and reactivity to the environment.

Sputter and selective removal. This approach involves sputtering or depositing a mask on the entire wafer, then using chemical mechanical polishing (CMP) or surface etching to leave a mask in pits, dislocations or remaining morphology characteristics (i.e., a trench between hex facets).

Surfactant Addition to Growth

Epi growth mechanism modification. Addition of surfactants into the growth environment as a crystallographic orientation propagation modifier is usefully employed for enhanced smoothing of unfinished FS (Al,In,Ga)N disparities and finished FS (Al,In,Ga)N disparities.

Mesa Etched FS GaN Layers for Re-growth and Facilitation of Smoothing and Defects Reduction Homo-epitaxial (GaN on GaN) growth. A homogeneous material (III-V nitride on III-V nitride) technique is employed, using a sufficiently large area to accommodate end device structure growth. Edges of the mesa enable crystallographic plane propagation termination as well as dislocation termination.

Mask vs. un-masked. The masked area around the mesa is used to prevent growth or the un-masked structure is etched to sufficient depth to allow large boundary layer diffusion time.

DETAILED DESCRIPTION OF SPECIFIC ASPECTS AND FEATURES OF THE INVENTION

The foregoing aspects and features of the invention are now more fully described.

Figure 11:
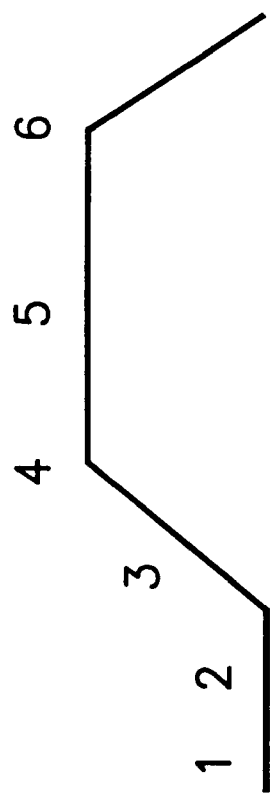
FIG. 11 shows a typical set of epitaxial growth process steps, wherein the vertical axis loosely denotes temperature and the horizontal axis loosely denotes time.

Referring again to the drawings, FIG. 11 shows a typical set of epitaxial growth process steps, wherein the vertical axis loosely denotes temperature and the horizontal axis loosely denotes time. Such process flow involves the steps of wafer cleaning, purging of the reactor, heat-up of the substrate, in-situ cleaning of the growth surface, growth of epi on the growth surface, and cool-down. These steps are discussed in detail in the ensuing description.

Cleaning of FS GaN Substrates

Various cleaning procedures for various substrates have been developed for use in GaN heteroepitaxy, such as for SiC and sapphire. FS (Al,In,Ga)N benefits from unique wafer cleaning processes, which enable high quality homoepitaxial growth. In the development of HVPE GaN based substrate materials, we have discovered that certain types of cleaning are essential for high quality homoepitaxial growth.

In particular, we initially discovered that the preferred method of cleaning 10 micron HVPE GaN/sapphire layers is extremely critical for proper epitaxial growth. For a period of time, we experience difficulty growing high quality epitaxial material on 10 micron HVPE GaN/sapphire base layers. The cause was discovered to be reactor products evaporating onto the surface of the grown substrate in the HVPE reactor upon unloading. To clean the GaN substrate surface, such as those produced by HVPE, which have residue (e.g., from $NH_4Cl$, Ga-rich byproducts, oxidation products or decomposed GaN surface material), additional cleaning measures are necessary beyond those that are utilized to clean standard sapphire wafers.

The standard sapphire cleaning process did not clean this product from the epitaxial substrate surface to an adequate extent, perhaps because cleaning processes for sapphire need to be less robust due to the low temperature interlayer that invariably is present and which re-crystallizes at higher temperatures absorbing some of these impurities at the substrate epitaxial interface. In our experience, O, Si and C can be present at the interface of sapphire and GaN, near the interlayer, and this contamination can interfere with homoepitaxial GaN growth.

Figure 12:
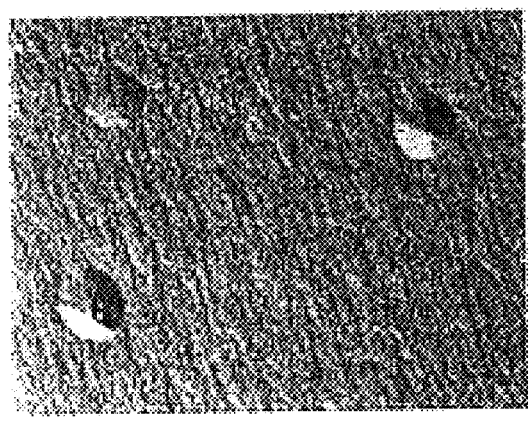
FIG. 12 is a photomicrograph at 65× of a rougher, finely pitted epitaxial morphology obtained with an old GaN substrate cleaning method.

We have developed a cleaning process for 10 micron HVPE GaN/sapphire that remedies the poor quality epitaxial problems that were initially experienced. The old cleaning process resulted in a rough epitaxial surface (shown in FIG. 12) with broad X-ray FWHM. Our new cleaning process, applicable to FS GaN, yields a smooth material with improved material quality.

Our preferred method is described below but other methods to remove the reactor products that evaporate onto the substrate surface upon unload can alternatively be utilized.

Illustrative Procedure:

Deionized water ($DIH_2O$) soak for 5 minutes;

$NH_4OH:H_2O$ (1:10) soak for 5 minutes;

Deionized water ($DIH_2O$) rinse;

$HCl:H_2O$ (1:10) soak for 5 minutes; and

Deionized water ($DIH_2O$) rinse.

This process is optionally modified to include methylene chloride ($MeCl_2$), acetone and isopropyl alcohol (IPA) cleaning prior to the previously described acid/base aqueous treatment.

The above-described process is usefully employed to clean HVPE GaN based substrate material, including both freestanding unfinished or finished GaN as well as 10 micron HVPE GaN/sapphire substrates.

Figure 13:
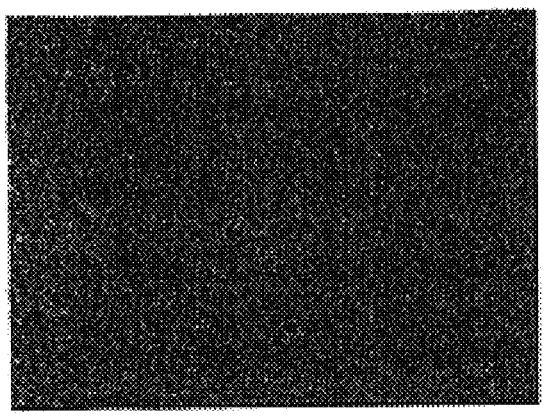
FIG. 13 is a photomicrograph at 65× showing a smoother epitaxial morphology obtained with a new GaN substrate cleaning method in accordance with one aspect of the invention.

It is speculated that the improvement of the epitaxial growth process on the 10 micron HVPE GaN/sapphire shown in FIG. 13 is afforded by the cleaning method of the invention is due to the removal of $NH_4Cl$ or other reactor products on the epitaxial substrate surface which have been either evaporated onto the substrate or form from surface decomposition during the HVPE GaN reactor unload.

This cleaning process is also usefully employed to clean oxide or other non-GaN products off the epitaxial surface. Further, such cleaning process has utility for cleaning off impurities or surface contaminants on epitaxial planes other than the c-plane which are exposed on the unfinished surface of both FS GaN and 10 micron HVPE GaN/sapphire.

Other, alternative cleaning methods are usefully employed to clean an unfinished FS (Al,In,Ga)N or a finished (Al,In,Ga)N surface.

An epi-ready surface of FS (Al,In,Ga)N may be produced by oxidizing the (Al,In,Ga)N substrate in $O_2$, air, an air/inert gas mixture, or a wet mixture to create a thin oxide layer, which is subsequently stripped in an alkali solution or etched off in other suitable manner just before growth. The purpose of this thin oxide layer is to getter or remove potential impurities from the substrate, and allow the first few monolayers of the substrate surface to be free of homo-epitaxial layer interrupting impurities (such as C, Si, S or O) and/or other impurities.

This process readily enables production of mobile products (CO, $CO_2$, $SO_2$, $O_2$) for ease of impurity removal at high temperatures. For example, S can be present in residual levels in the HVPE (Al,In,Ga)N substrate, which will inhibit perfect homo-epitaxial growth. By adding an oxidizer or oxygen to the treat the surface, the sulfur can be removed from the substrate by formation of $SO_2$ gas, thereby leaving the substrate surface and leaving behind a thin oxide layer which can be stripped prior to epi growth.

Oxidizing the surface of the (Al,In,Ga)N substrate can be utilized to enable defect location, as well as quantification, qualification of quality and/or enhancement of shelf-life of the epi wafer, with the surface of the oxide absorbing hydrocarbons and impurities from the environment and then being easily stripped and under-cut by a selective etch prior to growth.

The oxidation of the FS GaN surface can be utilized to preferentially oxidize the hillocks on the surface due to their greater surface energy and different crystal facets that are exposed. Thus, when the oxide is stripped a smoother surface or reduced aspect ratio of the hex hillocks is achieved, enabling an easier smoothing of the surface morphology.

Any of the aforementioned oxidations to prepare FS (Al,In,Ga)N unfinished or polished surface also can be varied or other nitride (dissimilar) compounds can be employed, including, but not limited to, sulfide, arsenide, antimonide, phosphide, and selenide, in order to facilitate selective etching or removal of dissimilar material at the surface.

RIE is another alternative method to preparing an epitaxial surface from an unfinished substrate or finished substrate. RIE can remove contaminants that are embedded into the substrate surface, such as finishing media and other material having the potential to outgas during heat-up and growth on the substrate. As mentioned, RIE is beneficially employed in instances where aggressive cleaning methods such as ultrasonic cleaning may have a tendency to crack or fracture fragile substrates.

Heat-Up Conditions for HVPE GaN Substrates

Just as cleaning and surface preparation are important for high quality epitaxial growth of GaN, the ambient conditions in the reactor are also important during the time in which the substrate is being heated to growth temperatures.

This issue involving ambient conditions is particularly more complicated with GaN substrates, compared to other substrates used for GaN epitaxy such as SiC and sapphire. This is due to the fact that GaN has a high N-vapor pressure at elevated temperatures and is likely to decompose without adequate $NH_3$ overpressure or appropriate heat-up conditions. This homo-epitaxial interface, between GaN epi and FS GaN substrate, is prone to contamination, decomposition and initiation of new defects or dislocations if the proper growth conditions are not utilized. Desirable and ideal heat-up conditions should do one or more of the following; 1) smooth the substrate surface, 2) remove damage on the substrate surface, 3) remove contaminants at the substrate surface, 4) reduce defect propagation at the interface and 5) eliminate new defect formation (vacancies, dislocations, inversion domains, etc.) at the interface, 6) reduce electrically active dislocations, 7) reduce substrate impurity outgassing and 8) incorporate compensating impurities at the interface.

In this respect, the art has not addressed heat-up conditions that permit epi growth on (Al,In,Ga)N to produce homo-epitaxial interfaces without one or more of the foregoing issues.

In other III-V materials such as GaAs, heat-up conditions of substrates are also critical in reducing contamination of the substrate epi interface and potential conductivity below the epi structure that can lead to poor isolation of devices and poor high frequency device characteristics.

In GaAs materials, impurities such as Si, C and O can affect the conductivity of the interface and parameters such as temperature, hydride flow and time have an affect on the conductive interface or contaminants. Potential conductivity at the homoepitaxial interface is also present for FS (Al,In,Ga)N substrates and 10 micron HVPE GaN/sapphire base layers. From time to time impurities are observed at the epitaxial film and HVPE GaN substrate interface. Reactor components may be partly responsible for this contamination of the GaN epitaxial growths. Growth conditions may also affect impurity extraction from growth reactor components (for example, $NH_3$ may corrode certain parts and enable impurity to pass into gas phase and be incorporated into the film).

Figure 10:
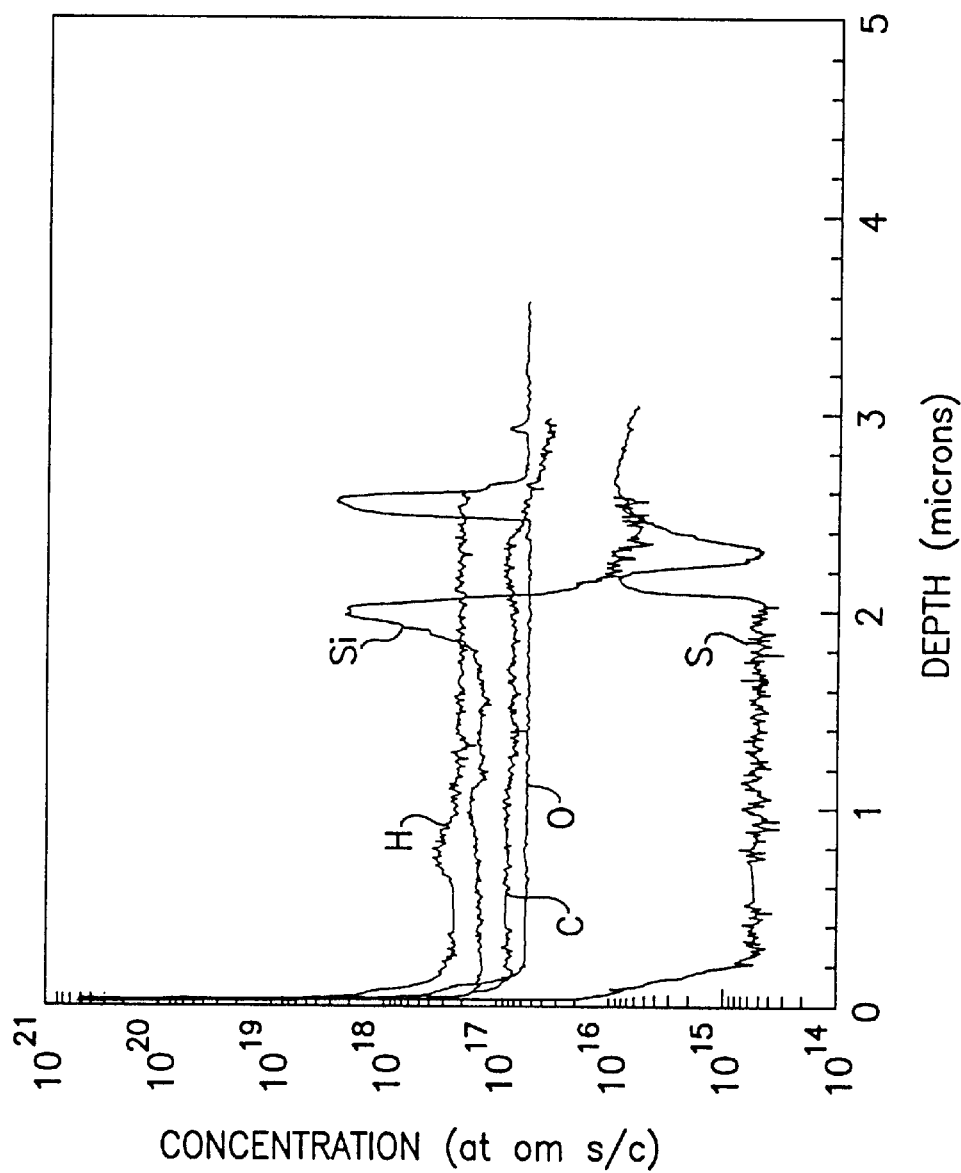
FIG. 10 is a graph of impurity concentration as a function of depth in microns, for GaN MOVPE epi on 10 micron HVPE GaN/sapphire structure. This plot shows silicon (Si)= 3e18 atoms per cubic centimeter, oxygen (O)=3.5E18 per cubic centimeter at the interface as well as a small sulfur (S) increase at the interface of 1E16 per cubic centimeter.
Figure 14:
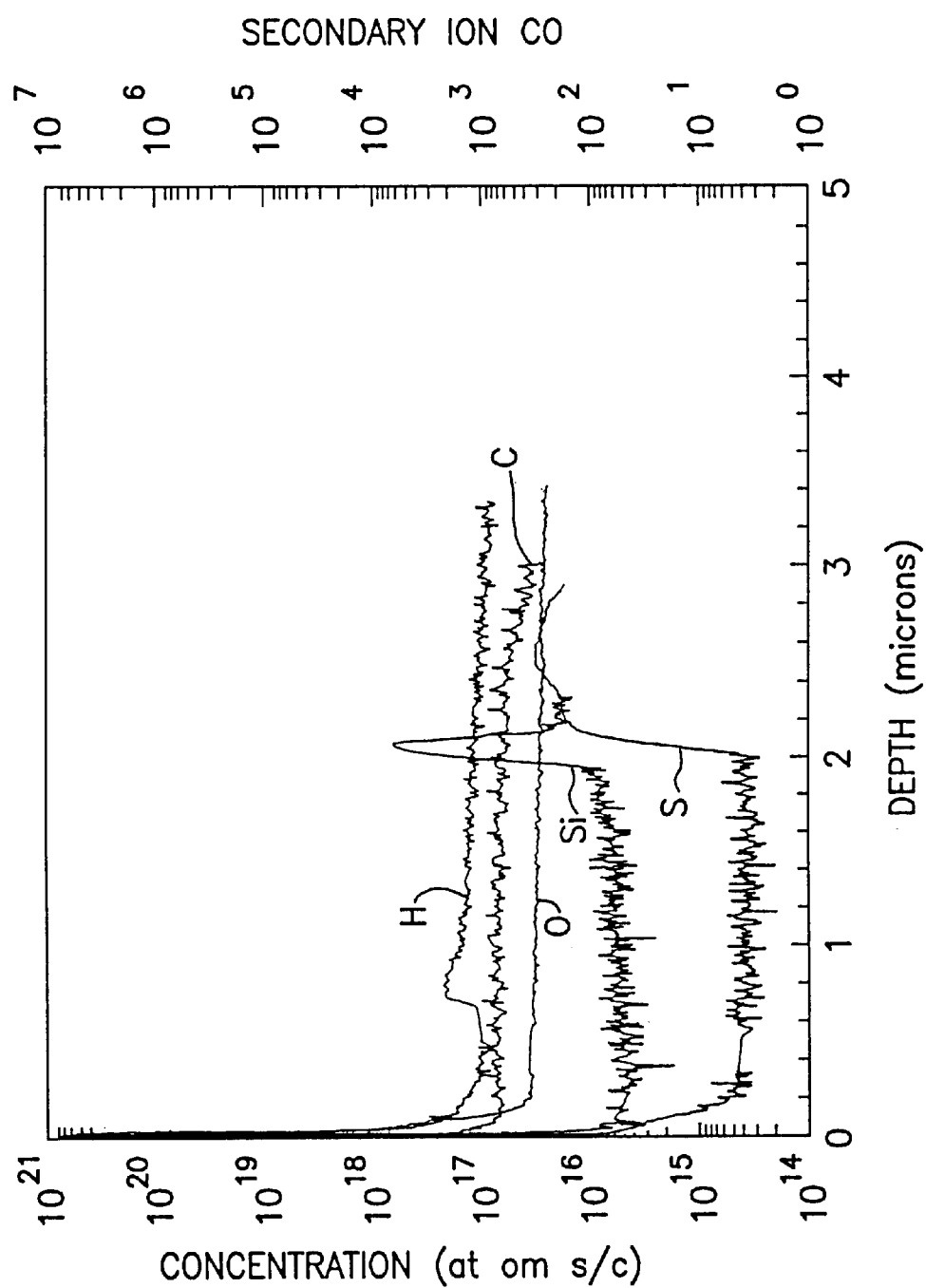
FIG. 14 is a concentration versus depth graph showing Si=1E18 atoms per cubic centimeter at the homoepitaxial interface and 5E16 atoms per cubic centimeter S in the substrate, producing good epitaxial morphology.

FIGS. 14 and 10 show how the condition of a susceptor, either coated with GaN products (results in FIG. 14) or uncoated with GaN products (results in FIG. 10) affects the impurities at the surface of the homoepitaxial interface of GaN and HVPE GaN substrate.

When using a susceptor that is not fully and adequately coated, including the wafer pocket, there is a tendency to obtain high concentrations of O, Si and S at the interface (3.5E18 cm−3, 3.0E18 cm−3, and 3E16 cm−3, respectively). This high concentration of impurities at the homo-epitaxial interface degrades homo-epitaxial growth and surface morphology.

This discovery is surprising because GaN growth on sapphire or SiC is not as sensitive to bare susceptor components and the interface of GaN and sapphire typically has one or more of Si, O and C. This may be due to the interlayer techniques used on these lattice mismatched substrates and the amenability of the interlayer to accommodate impurities and defects and prevent them from affecting the resultant epi layer. (Al,In,Ga)N surfaces may also have a greater affinity or sticking coefficient for these type of impurities or others. It has been discovered that concentrations below those stated above are required to produce high quality homoepitaxial GaN.

Furthermore, even in good quality homo-epitaxial material, >1E18 $cm^{-3}$ Si is still present at the interface and heat-up conditions therefore are employed that reduce this contamination.

In general, we have found that longer heat-up times and/or more time at temperature before growth onset are beneficial for smoother homo-epitaxial films grown on unfinished FS GaN. For example, a higher $NH_3$ flow ($P_{NH3}$=37 torr) and longer heat to growth time (8 min) resulted in a superior atomic force microscope (AFM) surface roughness of 0.16 nm. Higher $NH_3$ flow resulted in the most uniform AFM step structure over the entire wafer surface (preferably fewer than 12–14 AFM steps per 2 micron length, or 1600 Angstroms per step).

Preferred heat-up conditions for low pressure MOVPE growth include the use of nitrogen species ($NH_3$, amines, $N_2$) with partial pressures from about 1 torr to about 500 torr, a ramp time of from about 1 minute to about 1000 minutes, temperature ramp rates of from about 10° C. per minute to about 1000° C. per minute, and use of ambient including species such as $H_2$, $N_2$, Ar, He, Ne, and HCl and mixtures. Most preferred heat-up conditions parameters, include nitrogen species ($NH_3$, and $N_2$), partial pressures from 10 torr to 400 torr, ramp time of 1 minute to 100 minutes, temperature ramp rates of 100 degrees Celsius per minute to 400 degrees Celsius per minute and ambient including one or more of $H_2$, $N_2$, Ar, He, Ne, and HCl.

Corresponding conditions are readily empirically determinable without undue effort, for atmospheric pressure MOVPE reactor systems.

It is notable that the heat-up conditions best suited for FS GaN substrate are not the same as the heat-up conditions for 10 micron HVPE GaN/sapphire. For the FS (Al,In,Ga)N substrate, higher $NH_3$ flow and longer heat-up smoothed morphology of epi grown thereon. This clearly indicated that the conditions chosen to heat-up unfinished FS GaN wafers to temperature are separate and distinct from the conditions that are optimal for 10 micron HVPE GaN/sapphire substrates. This may be due to the different crystallographic planes or offcuts exposed on an FS GaN unfinished wafer as opposed to a 10 micron HVPE GaN/sapphire layer.

Figure 15:
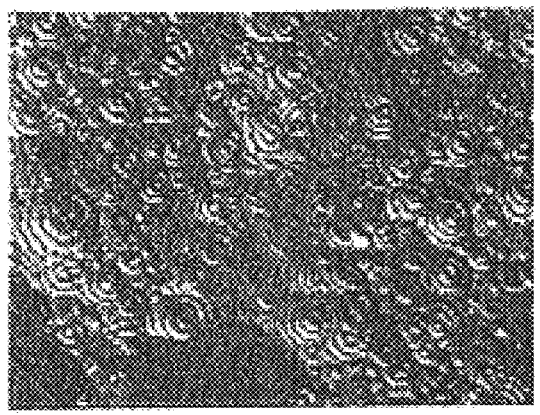
FIG. 15 is a micrograph of an epilayer on 10 micron HVPE GaN/sapphire showing fish-scale and rough surface morphologies deriving from the growth conditions employed in the film formation.

Using more optimal conditions appropriate for FS GaN substrates for 10 micron HVPE GaN/sapphire resulted in the formation of more fish-scale and rough surface morphologies on the 10 micron HVPE GaN/sapphire, as shown in FIG. 15. This morphological variation is consistent with differences in surface morphology in the two different HVPE GaN substrate materials and the different proportion and type of crystallographic facets or offcuts present in FS GaN substrates compared to 10 micron HVPE GaN/sapphire substrates and the different morphological aspect ratios (height, width, relative width to height).

Other considerations for FS GaN heat-up conditions include heat up conditions that suppress the out-gassing of native impurities in FS GaN, such as S and O, that inhibit good homo-epitaxial growth initiation. Sulfur has been found on HVPE GaN/sapphire wafers using Auger spectroscopy and Secondary Ion Mass Spectroscopy (SIMS) when standard heat-up conditions were used to heat the substrate material to growth temperature and then cooled down. It is suspected that this sulfur material derives from the substrates. Similar issues in other lattice-matched substrates have been encountered as in LGO and LAO where Li impurities and substrate decomposition dramatically affect the epitaxial and interface quality. Additionally, sapphire and SiC substrates have potential issues with species such as Si, C and O, when such species contaminate the interface.

An alternative to coping with these potential impurities at FS GaN and epitaxial GaN interfaces which are electrically active and conductive, is to compensate them with a deep compensating donor or acceptor such as Mg, Be, C, Si, Ge, O, S, Ca, Fe, Ta, V and Ba to generate charge neutrality without affecting the interface quality.

Heat-up conditions can affect the way epi nucleates and can modify how dislocations or defects are propagated.

Epi on Various Crystallographic Planes of FS GaN (Orientation)

Figure 16:
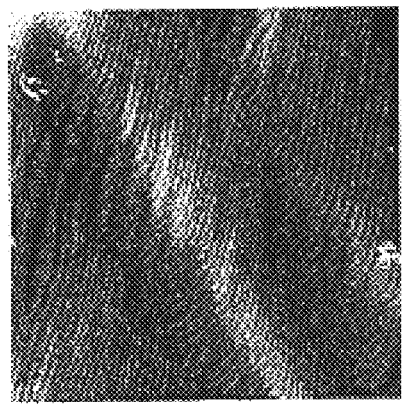
FIG. 16 shows an AFM scan of a 10 micron GaN epitaxial layer grown on unfinished FS GaN demonstrating well defined step structure, low dislocation density and parallel steps.

The epitaxial growth on c-plane on-axis FS GaN substrates has been found to be superior to growth on alternative substrates such as sapphire, SiC and LEO (lateral epitaxial overgrowth) or ELOG (epitaxial lateral overgrowth) materials. Typically the AFM structure of GaN epi on these alternative substrates has non-parallel, irregular step structure, with multiple step terminations, but GaN epi on FS GaN, as shown in FIG. 16 shows a well defined step structure, low dislocation density and parallel steps.

The epitaxial step structure of this wafer is superior to that of any other GaN film on any other substrate published to date of which we are aware, due to its improved parallel step structure, reduced step terminations and reduced pits. Typically, with GaN epitaxy on other substrates the AFM step structure is irregular or not well-defined and defect sites are clearly visible.

Figure 17:
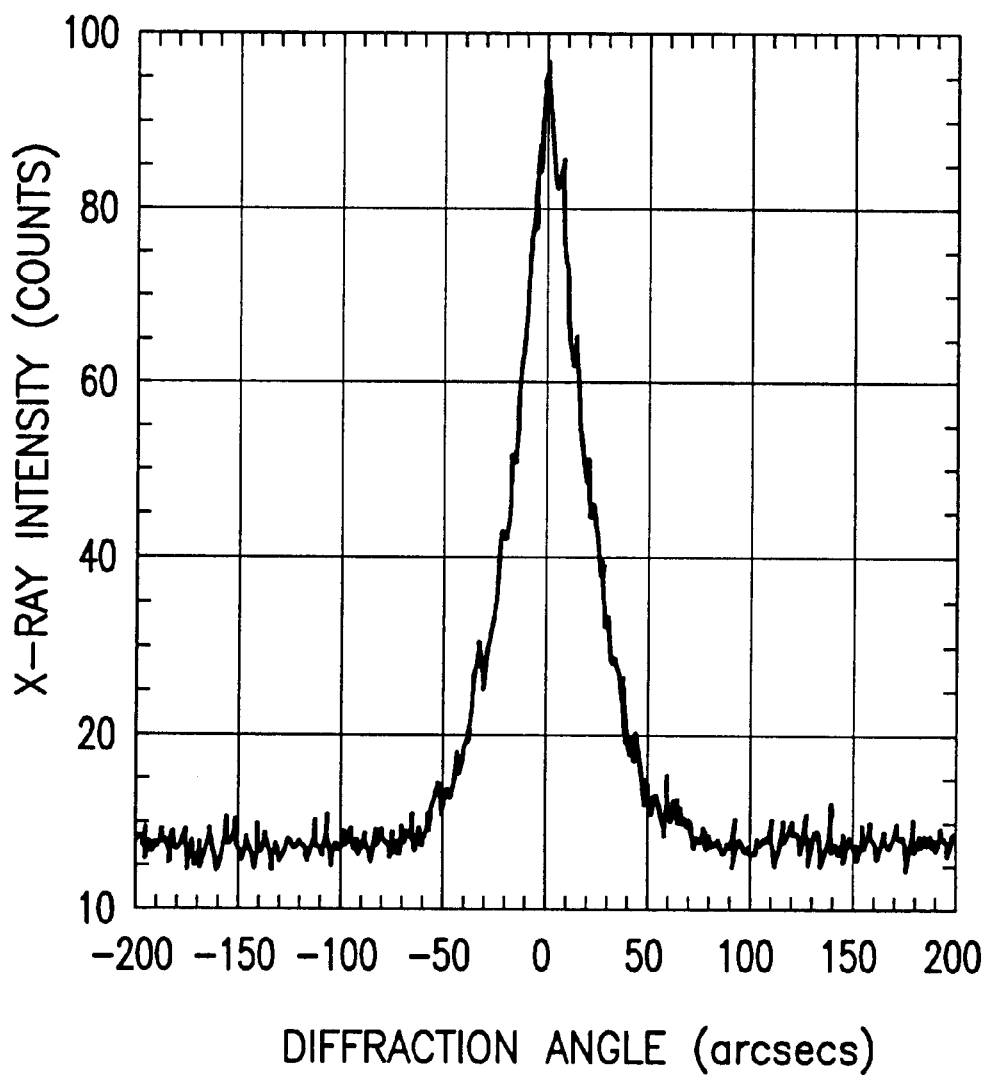
FIG. 17 is a DCXRD spectrum of GaN PIN on 10 micron GaN epi on unfinished FS GaN.

The x-ray characteristics of the GaN epi on the FS GaN is superior exhibiting (0004) reflection FWHM of 73 arcsecs as shown in the DCXRD spectrum of GaN PIN on FS GaN in FIG. 17.

Figure 18:
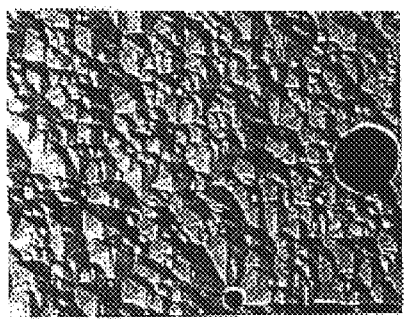
FIG. 18 is a micrograph of unfinished FS GaN substrate at 130× magnification.
Figure 19:
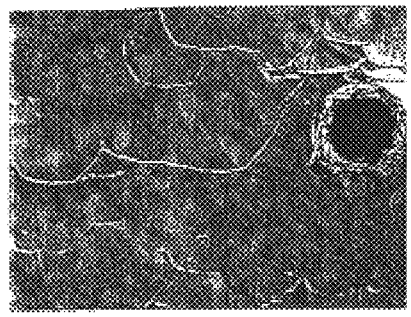
FIG. 19 is a micrograph of 10 micron GaN epitaxial MOVPE layer on unfinished FS GaN, at 130× magnification.

The x-ray characteristics of the GaN epi on the FS GaN is superior exhibiting (004) (this is OK it can be either) reflection FWHM of 73 arcsecs as shown in the DCXRD spectrum of GaN PIN on FS GaN in FIG. 17. Some of the best surface morphologies ever obtained from an epitaxial layer grown on HVPE GaN are shown for the substrate in FIG. 18 (FS GaN substrate unfinished at 130× magnification) and in FIG. 19 (10 $\mu$m GaN epitaxial MOVPE layer on unfinished FS GaN in FIG. 18, at 130× magnification). The surfaces show the ability of the epitaxial growth process to smooth out the surface.

The present invention embodies growth conditions that tend to preferentially smooth out the unfinished FS (Al,In,Ga)N substrate surface and are broadly applicable to smoothing of finished substrate disparities. These growth conditions on unfinished FS GaN substrates that tend to smooth out the substrates surface are distinct from the growth conditions that give good smooth homoepitaxial growth on 10 micron HVPE GaN/sapphire wafers or SiC wafers. The differences between optimal growth conditions on these types of substrates suggest that the growth mechanisms that produce smooth epi on FS GaN substrate are different, at least in part from those of growth on 10 $\mu$m HVPE GaN/sapphire. For example, higher $NH_3$ flow or higher V/III ratio during growth on FS GaN enables pit filling of a FS GaN substrate while the same growth conditions yield interrupted fish-scale morphologies on 10 micron HVPE GaN/sapphire substrates. Such fish-scale morphology would also be anticipated for MOVPE GaN/sapphire substrates or GaN on SiC substrates.

The homoepitaxial thin films achieved in the practice of the invention on FS (Al,In,Ga)N have higher mobility and sheet charge than any other substrate due to the uniform nature and low dislocation density of the epilayer. Low dislocation density also enables higher dopant incorporation (e.g., of Mg) without deep level compensation if the p-GaN compensating complexes are associated with a dislocation or other structural defect. Due to the higher quality of the epi and substrate, for a given final surface or material quality, higher carrier concentrations (dopant incorporation) can be achieved (e.g. hole concentrations from Mg) compared to epitaxy produced on sapphire. Since room temperature carrier concentration (e.g. Mg acceptor concentration) is in part limited by solubility (e.g. Mg solubility), higher material quality enables modification, e.g., enhancement of solubility. This is also true of other dopants.

Orientation

Possible substrate orientations for epi growth of GaN in the practice of the invention include offcuts from (0001) or (000$\bar{1}$), where offcut angle magnitude and direction are important, families of on-axis planar faces such as $\{11\bar{2}0\}$ and $\{1\bar{2}00\}$, offcuts from these other faces, and the face itself (Ga and N). In GaAs, both electronic and optoelectronic devices have been shown to exhibit a strong dependence on the substrate (crystal plane and polarity) and the device orientation, and GaN involves similar considerations. The most desirable GaN substrate orientation in various embodiments is application specific: from device-to-device, depending on whether MBE or OMVPE is employed, depending on the material, alloy, conductivity type and structure being grown.

Offcuts From (0001)

The (0001) face—the Ga face—is typically used for GaN-based MOVPE growth on GaN substrates. Step structure of GaN epi films on various c-axis substrates and substrates with regions containing surfaces slightly misoriented from the c-axis have been evaluated via AFM (Atomic Force Microscopy) on four square micron areas. The raw AFM data was compared without taking probe tip effects into account. Due to the 1 nm lateral probe tip displacement (probe tip effect), raw data analysis results in some number of Ga—N bi-layer steps to be missed and an underestimate of the off-cut angle from the c-axis. However, useful data can be obtained from the raw AFM data without the exact determination of the orientation of GaN crystal with techniques such as LAUE or RHEED. With the raw AFM data, we have been able to assess the novel and non-obvious nature of GaN epi on "finished" and "unfinished" FS GaN substrate and have formulated the following observations based on AFM data obtained and analyzed in the above described method:

1) GaN epi on "finished" and "unfinished" GaN substrates has typically parallel and regular steps with fewer step terminations at defects compared to epi on heterogeneous substrates such as SiC and sapphire.
2) Epitaxial GaN layers grown on "finished" and "unfinished" GaN substrates are typically mis-oriented from the c-axis by up to several degrees based on a calculation of the step height and terrace width data from AFM scans. Regardless of the mis-orientation, we typically observe regular and parallel steps. GaN epitaxy grown on heterogeneous substrates such as sapphire and SiC typically exhibit irregular steps and typically less of a mis-orientation from the c-axis as determined from AFM scans.
3) Step heights are typically in the range of 1.2 to 12.0 angstroms for GaN epi on "finished" and "unfinished" GaN substrates while GaN epi layers on heterogeneous substrates such as sapphire and SiC typically exhibit 2.5 to 6.0 angstrom step heights. Unfinished GaN substrates typically exhibits a rougher surface and therefore greater local mis-orientation with respect to the c-axis. Epitaxy grown on these larger mis-orientation angle surfaces from the c-axis typically exhibits greater step heights, but still no step bunching (i.e. no steps greater than 5.0 nanometers).
4) Terrace widths are typically in the range of 300 to 2400 angstroms for GaN epi on "finished" and "unfinished" GaN substrates while GaN epi layers on heterogeneous substrates such as sapphire and SiC typically exhibit terrace widths in the range of 700 to 2400 angstroms. Unfinished GaN substrates typically exhibit a rougher surface and therefore local greater mis-orientation with respect to the c-axis. Epitaxy grown on these larger mis-orientation angle surfaces typically exhibit smaller terrace widths.
5) Using terrace width and step height data from AFM raw data analysis, vicinal off-cuts from the Ga-face (c-axis) are typically 0 to 1.5 degrees for GaN epi layers on "finished" and "unfinished" GaN substrates. Off-cuts for GaN epi layers on heterogeneous substrates such as SiC and sapphire are typically less than 0.5 degrees off-cut from the c-axis.

The potential benefits of using offcut directions from <0001> may be based, for example, on SiC and GaAs epitaxial growth considerations. For example, in SiC, the offcut creates surface steps whose ideal height and width are related to the magnitude of the offcut angle and the polytype. The surface steps promote homoepitaxial growth—step flow growth—where the epilayer inherits the stacking sequence of the substrate.

In this manner, high quality films are grown at lower (by $\approx 300°$ C.) substrate temperatures compared to growth on on-axis SiC substrates. In GaAs, offcut orientation takes a dramatic role in the process conditions for epitaxial growth and the quality of the epitaxial layer. Similar considerations are applicable to III-V nitride growth on (Al,In,Ga)N substrates. For example, the growth of In containing compounds which typically necessitate lower growth temperatures and differing ambients than higher temperature GaN growth because of the high elemental vapor pressure of In and N in In-containing compounds may have growth conditions which are enabled to produce higher quality material at higher indium composition at higher temperatures due to offcut and orientation considerations. The direction of the offcut is also important in determining film quality, doping, etching, reactivity and other properties. The magnitude of the offcut is also a consideration: for example, in 4H SiC an 8° offcut typically is preferred over a 4° offcut to reduce triangular inclusion defects. Larger offcut magnitudes can correspondingly reduce dislocations in GaN, but there are also isotropy considerations.

On-axis Not (0001)

Many of the same considerations exist for these orientations as for those described above. For example, in SiC, the effect of micropipes can be eliminated on material cored along the a-axis direction. Pits and dislocations are found in GaN and reduction of their effect through selection of the crystal orientation may be important for GaN as well. In SiC there is a 10× increase in n-type doping when a-face substrates are used. This drastic doping increase has strong implications for increasing p-type doping in GaN. In SiC, the electron and hole ionization coefficients are generally determined to be more uniform on a-face material, and similar considerations are implicated for GaN. Other device design considerations are also important, in terms of cleavability, RIE, finishing, and other device fabrication issues.

Ga or N Face

In GaN, dramatically different morphologies arise from growth on N-face and Ga-face crystals using the same growth parameters. In SiC the epitaxial growth process window is thought to be somewhat wider on the Si face, and a wider range of doping can typically be achieved for identical parameters when the Si face is employed. Many of the aforementioned considerations are also relevant for growth on the two different GaN faces. Optimal growth parameters are determinable for both the Ga and the N faces of FS GaN substrates.

More generally, employing different GaN substrate offcuts, orientations or faces permits reduced growth temperatures in various applications, and InGaN can be grown at different temperatures. Step flow growth can be effected and ternary uniformity can be selectively improved or altered. The use of different GaN substrate offcuts, orientations or faces in various aspects of the invention enables: enhanced dislocation annihilation, increased critical thickness, reduction of cracking or avoidance of cracking entirely, alteration of growth rates; growth of different polytypes; use of different growth precursors on offcut GaN substrates; improvement of growth efficiencies; and use of optimally different—or simpler—forming interlayers schemes and interlayers for growth on GaN substrates.

In reference to forming interlayers (use of interlayers), forming interlayers is generally not preferred in the practice of the present invention, but in some embodiments is usefully employed to selectively eliminate certain types of defects and to reduce the smoothing times of the unfinished substrate surface or to eliminate the need for comprehensive polishing steps and is discussed in greater detail hereinafter.

Increased Mg or p-type doping in general may be achieved when alternative orientation, face or offcut GaN substrates are used. Si or n-type doping, in general, can also be altered. Impurities such as but not limited to oxygen or carbon contamination can be reduced and other incorporation such as H can be effected. The use of alternative orientation, face or offcuts can also affect defect formation, including vacancies, dislocations, defect complexes and passivation of dopants. Impurity diffusion can be altered, intentionally or incidentally, and other dopants can be utilized.

The piezoelectric effect can be altered when alternative orientation, face or offcut GaN substrates are employed, yielding selectively alterable effects which are usefully exploited for HFETS and other devices. Transport properties likewise can be altered, especially as they relate to dislocation formation and/or reduced unintentional impurities. The optical properties can be improved, due to better interfaces or reduced unintentional impurities, or improved crystalline quality or other effects. InGaN ordering can be altered, and alloy segregation can be effected and exploited. AlInGaN may be more readily controlled and effected with a more homogeneous set of process conditions. Smoother facets can be cleaved to improve optical devices on substrates with different offcuts, face or orientations. Specific orientations, faces or offcuts also provide advantages for passivation coatings due to alterations in the density and orientation of dangling bonds on the different surfaces. The ohmic and Schottky contact stoichiometry and morphology can also be altered.

Figure 20:
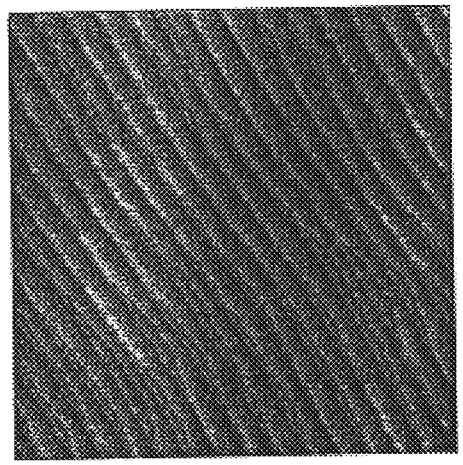
FIG. 20 is an atomic force microscope (AFM) micrograph of epitaxial growth on a hex hillock, in a 2 micron×2 micron view.
Figure 21:
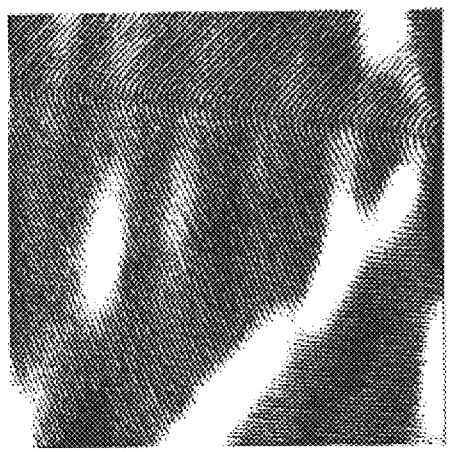
FIG. 21 is an atomic force microscope (AFM) micrograph of epitaxial growth on a hex hillock, in a 10 micron×10 micron view.
Figure 22:
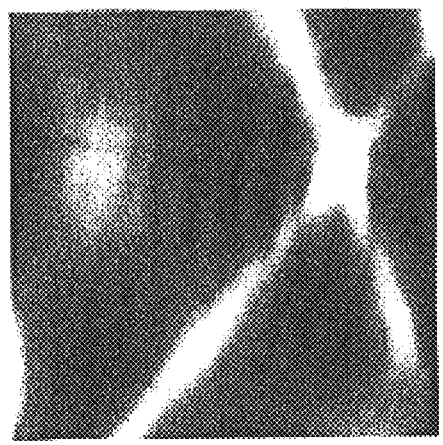
FIG. 22 is an atomic force microscope (AFM) micrograph of epitaxial growth on a hex hillock, in a 20 micron×20 micron view.

There is not a significant amount of step bunching on either the on c-axis orientation of the epi or sidewalls of the hex hillocks. This is shown in FIGS. 20–22, which are atomic force microscope (AFM) micrographs of epitaxial growth on a hex hillock, demonstrating vicinal or non-(0001) epitaxial growth with a low incidence of step bunching. FIG. 20 shows a 2 micron×2 micron view, FIG. 21 a 10 micron×10 micron view and FIG. 22 a 20 micron×20 micron view.

This is the first report of which we are aware of a non-(0001) or >0.5 degree off-cut homoepitaxial step-flow crystal growth on free-standing GaN.

Modification of epi growth conditions when depositing epitaxial layers on FS GaN can change the surface morphology and affect the smoothing of the wafer. This is an unexpected pathway to high material quality growth on FS GaN. We have found that when using HVPE FS GaN substrates, the starting unfinished FS GaN wafer has surface features that make it unique compared to other starting substrate materials.

Figure 23:
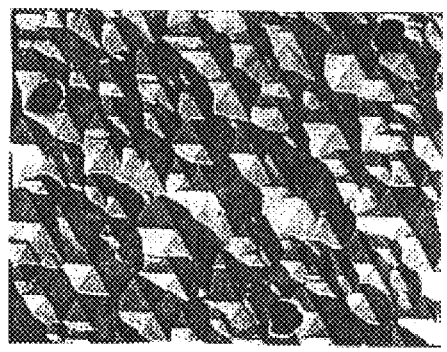
FIG. 23 shows a micrograph at 130× magnification of a typical unfinished FS GaN substrate morphology.
Figure 24:
FIG. 24 is a micrograph at 130× magnification of a 10 micron GaN epi on FS GaN with $NH_3$=standard (2.2 slm) and reactor pressure=standard (100 torr).
Figure 25:
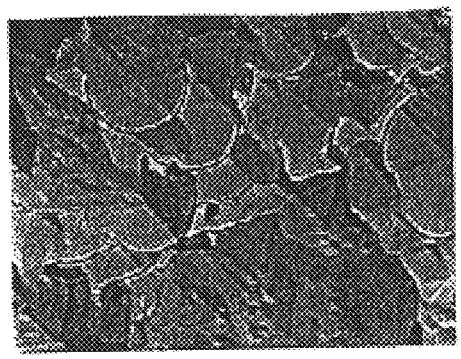
FIG. 25 is a micrograph at 130× magnification of a 10 micron GaN epi on FS GaN with $NH_3$=2×standard (4.4 slm) and reactor pressure=standard (100 torr).
Figure 26:
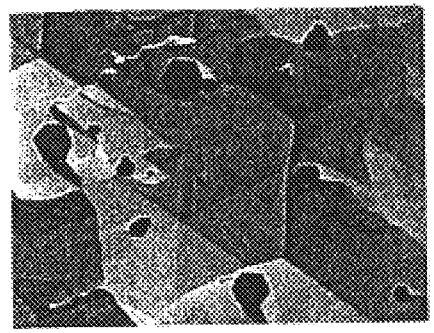
FIG. 26 is a micrograph at 130× magnification of a 10 micron GaN epi on FS GaN with $NH_3$=standard (2.2 slm) and reactor pressure=2×standard (200 torr).
Figure 27:
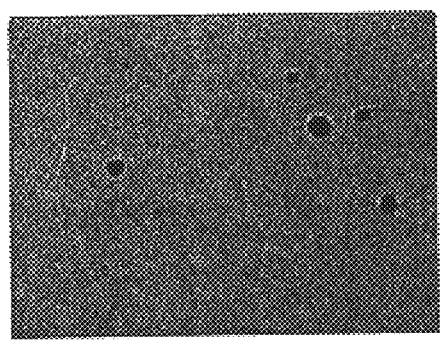
FIG. 27 is a micrograph at 130× magnification of a 10 micron GaN epi on FS GaN with $NH_3$=2×standard (4.4 slm) and reactor pressure=2×standard (200 torr).

This is shown in FIG. 23, which shows a micrograph at 130× magnification of a typical unfinished FS GaN substrate. Hex hillocks and inverted pits are present on the substrate surface and are atypical surface features on other homo-epitaxial growth surfaces in Si, other III-V materials and WBG semiconductors. These hex hillock and inverted pit features do not always appear on all substrates in the same number or size and desirably are minimized or eliminated from the substrate. These hex hillock and inverted pit features may be possible to remove via finishing but there are issues with finishing GaN materials due to their hardness and brittleness. It therefore is highly advantageous and novel to produce a high quality smooth homoepitaxial film directly on the unfinished substrate material, thereby reducing the cost of the substrate and improving the availability and applicability of the substrate in lower cost margin applications.

Novel and unexpected epitaxial smoothing is demonstrated with various GaN MOVPE growth conditions as shown in FIGS. 24–27.

FIGS. 24–27 demonstrate how epitaxial growth conditions affect the smoothing of FS GaN substrate surfaces.

In one illustrative embodiment, GaN growth conditions including a 100 torr reactor pressure and 4.4 slm of $NH_3$ yielded a uniform AFM step structure across the wafer surface as measured by three areas via AFM (with 10–15 steps per 2 micron length of the wafer surface).

Adjusting the epitaxial growth conditions has a dramatic effect on the end smoothness and morphology of the epitaxial thin film. In general, $NH_3$ flow rate, reactor pressure, growth temperature and growth rate have been found to affect the smoothing of the FS GaN unfinished surfaces and implicate corresponding results for finished substrates. Preferred low pressure growth conditions ranges include V/III ratio from 1 to 100,000, $NH_3$ partial pressures of from about 1 torr to about 500 torr, growth temperature from about 500 degrees Celsius to about 1250 degrees Celsius and growth rates from about 0.1 micron per hour to about 500 microns per hour. Most preferred growth conditions for low pressure growth include V/III ratio from about 10 to about 50,000, $NH_3$ partial pressures of from about 20 torr to about 400 torr, growth temperature from about 1000 degrees Celsius to about 1150 degrees Celsius and growth rates of from about 0.5 micron per hour to about 10 microns per hour. For indium containing compounds much different, lower growth temperatures are typically facilitated. In the case of In containing epi layers, the preferred temperature for which preferred growth temperature is >500° C. Atmospheric pressure processes can be discerned without undue experimentation from the preceding discussion of growth conditions.

Epitaxial growth conditions, such as reactor pressure and $NH_3$ flow, may also affect the degree of pit filling on the unfinished FS GaN substrate material. The preferred growth conditions are the same as those described above. With certain growth conditions, higher V/III pits can be filled completely, as shown in FIGS. 28 and 29.

Figure 28:
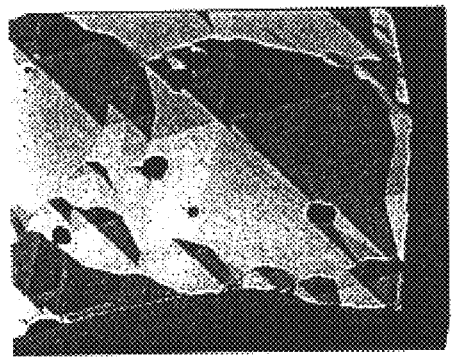
FIG. 28 is a micrograph at 130× magnification of an unfinished FS GaN morphology.
Figure 29:
FIG. 29 is a micrograph at 130× magnification of a 10 micron GaN epi on substrate from FIG. 28, showing pit filling

FIGS. 28 and 29 show before and after growth morphology, respectively, using higher $NH_3$ flow, as advantageously affecting the pit-filling process, and demonstrating that pit-filling is dependent on growth conditions.

Higher growth rates (>5 microns per hour) have a comparable affect on the morphology smoothing as do lower growth rates. Higher growth rates enable smoothing of the wafer surface more quickly than lower growth rates enabling improved process throughput and reduced process costs. By changing the growth conditions of the epi layer on FS GaN substrate, the limiting growth step mechanisms for epitaxial growth are modified and different growth rates, impurity incorporation, dislocation propagation and general epitaxial quality are achieved on the various crystallographic orientations and miscuts of FS GaN substrates. The smoothing process in growth on FS GaN does not require a mask set and is likely to have less background doping contamination issues than LEO, or Pendeo or ELOG growth processes. Further, the growth conditions that smooth out HVPE GaN unfinished substrates are different than the growth conditions that are employed to grow smooth epitaxial films on smoother 10 micron HVPE GaN/sapphire layers. This is shown in FIGS. 30 and 31 in which optimum growth conditions for FS GaN smoothing are employed in GaN epi growth on an FS GaN substrate and on a HVPE GaN/sapphire base layer substrate.

Figure 30:
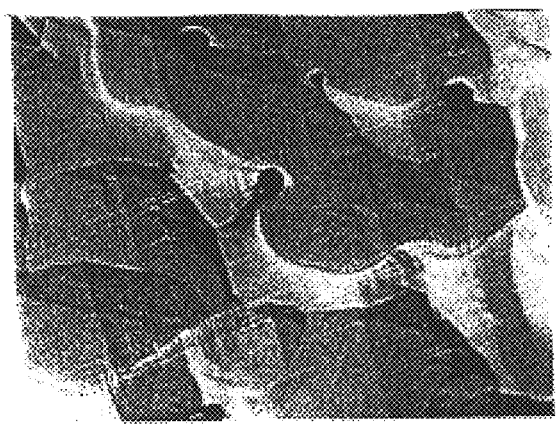
FIG. 30 is a micrograph of the morphology of a target 10 micron GaN epi growth on FS GaN, showing morphology smoothing.
Figure 31:
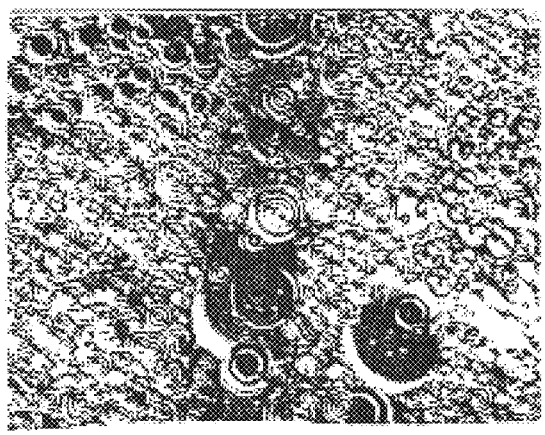
FIG. 31 is a micrograph of the morphology of a target 10 micron GaN epi growth on 10 micron HVPE GaN/sapphire base layer.

FIGS. 30 and 31 present a comparison of preferred smoothing conditions on FS GaN to same conditions on 10 micron HVPE GaN/sapphire base layers, demonstrating that different growth mechanisms and/or smoothing conditions are needed on different substrates. More specifically, these micrographs show that higher $NH_3$ flow and reactor pressure produce a rougher circular defect morphology on HVPE GaN/sapphire but have a positive effect on FS GaN substrate growth and smooth morphology.

Growth on unfinished FS GaN substrates is much more smooth with higher $NH_3$ flow than the same growth on HVPE GaN/sapphire. Adjusting the growth conditions of the GaN MOVPE film affects the dislocation propagation in the film and reduces the number of dislocations in the epitaxial film. Certain types of defects can therefore be eliminated by simply growing on the different crystallographic planes exposed on the unfinished FS GaN wafer, to eventually smooth the entire epi surface.

The growth conditions, including but not limited to growth rate, $NH_3$ flow, reactor pressure, growth temperature, V/III and $PNH_3$, have an effect on how and what type of dislocations propagate or initiate in the interface of the epitaxial layer and the substrate. Changing growth conditions, V/III, $PNH_3$, temperature and growth rate, to facilitate surface smoothing or dislocation reduction can be usefully employed to modify the step flow growth of the epitaxial layer.

Tilt of the HVPE GaN crystals or mosaic pattern in relation to one another can also be an issue for epitaxial growth of GaN on FS GaN and adjustment of the growth conditions can affect growth on mis-oriented grains. The X-ray FWHM of the GaN crystal is a function of the slit size or width of the X-ray beam. In addition, the FWHM of epi on FS GaN can have a broader FWHM than the original FS GaN unfinished substrate. This could be due to the epitaxial film or substrate issues, including but not limited to, bow of the wafer during epitaxy growth or crystallographic defects. Modification of growth conditions may be employed to adjust this tilt or relative miss-orientation to one another.

Consistent with the dramatically different morphologies produced for growth on FS GaN compared to HVPE GaN/sapphire for the same set of growth conditions, different growth conditions can be employed to smooth different sized hillocks, hex pits or substrate disparities in general. This is due to the fact that the planes of the hex hillock, or hex pit preferably use different growth conditions to propagate and smooth compared to a standard growth process to propagate the c-plane of the crystal.

Figure 32A:
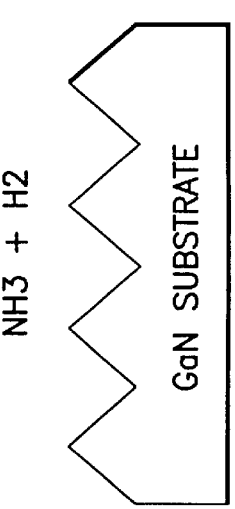
FIG. 32 shows a two-step process embodiment of a multi-step process for smoothing an FS GaN unfinished surface.

The present invention contemplates a multi-step growth process by which the first layer smoothes the crystal hex facets or defects found on unfinished material or introduced in imperfect finishing, then the additional growth process continues the c-plane axis, continues the smoothing, and forms the device layers. Optimizing the thickness and growth parameters of both process steps enables an optimum smoothing of the FS GaN of the unfinished surface. FIG. 32 shows a two-step process embodiment of a multi-step process for smoothing an FS GaN unfinished surface. The left-hand panel (FIG. 32A) of FIG. 32 shows the GaN substrate in an ambient of $NH_3$ and $H_2$. The middle panel (FIG. 32B) of the Figure shows the epi layer as having been formed to smooth the GaN substrate. The right-hand panel (FIG. 32C) of the Figure shows the epi layer as having been further grown to propagate the GaN epitaxy for purposes of forming device structures.

The invention therefore contemplates in one embodiment a two-step process on finished or unfinished material, including a first set of process conditions to reduce substrate processing imperfections, and a second set of (normal) processing conditions to grow device structure(s) on the substrate.

Doping of the epitaxial film can also be used to smooth out the surface of the wafer. In general, when growing GaN:Si, the morphology tends to be smoother and this characteristic can also be used in epitaxy for FS GaN smoothing.

Etching (RIE, KOH, etc.) pits to better define the growth surface and then growing over them is another way to eliminate the pits. This methodology is useful regardless of the defect or particulate that is the cause of the pit, with appropriate growth conditions being employed to fill the pit.

Growth conditions that suppress contamination of the epitaxial film from impurities from the native crystal (e.g., S and O in FS GaN) are advantageous and enable low background epitaxial films to be grown.

Growth conditions, such as higher temperature, can be employed to force different polytypes of the GaN crystal, thereby offering corresponding advantages in material and device properties.

Growth conditions on unfinished FS (Al,In,Ga)N can be employed to vary the mechanism in which smoothing of FS (Al,In,Ga)N hex mounds occur. Two different methods are usefully applied, one in which the existing crystallographic planes of the hex mounds are propagated at a lower rate than nucleating c-planes in the valleys, and the other in which the existing crystallographic planes of the crystal hex mound propagates through some range of vicinal surface, ending with an on axis or vicinal c-plane surface. These approaches can be applied to other crystallographic planes in the (Al,In,Ga)N crystal.

Backside Evaporation Suppression

Figure 33:
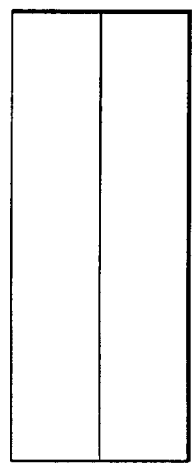
FIG. 33 is a schematic view of a substrate with epi being grown thereon, illustrating the transport of backside product and interruption of the epi surface morphology.
Figure 33:
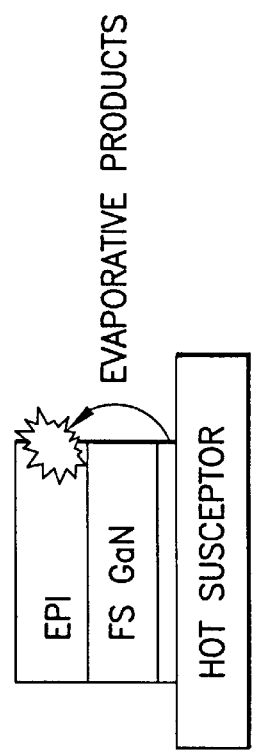

The growth of MOVPE (Al,In,Ga)N on native (Al,In,Ga)N substrates is complicated by the fact the backside (e.g., an N-face) of the substrate has a tendency to evaporate. This evaporation or decomposition product tends to transport into the reactor ambient, with potential for depositing on the epi surface and causing surface damage or growth ambient transients that impairs epitaxial layer quality. The diffusion of this product interrupts the epi surface morphology as schematically illustrated in FIG. 33, showing the migration of backside evaporative products to the epilayer and interrupting the surface.

The occurrence of epitaxial surface interruptions by evaporation/decomposition products on the backside of the wafer is unexpected, since it is anticipated that $NH_3$ or nitrogeneous species in growth ambient would suppress the decomposition of such products.

We have found that this occurrence of epitaxial surface interruptions by evaporation/decomposition products on the backside of the wafer of 10 micron HVPE GaN/Sapphire can be minimized by polishing or finishing the backside of the wafer, to remove the backside deposition products and reduce their surface energy and/or to remove the poly crystalline material. Finishing the backside of the wafer also provides more uniform contact with the susceptor to minimize the occurrence of hot spots and finishing is advantageous in removing the defects that decompose more readily.

We suspect that this evaporative product is GaN evaporating off the backside of the FS GaN wafers and escaping into the growth environment due to high elemental vapor pressure of N in GaN at elevated temperatures. This evaporative product mixes with the growth environment and transports to the epi surface resulting in epitaxial growth interruption. The backside of the GaN substrate is stable in our experimentation to about 1050 degrees Celsius but at temperatures higher than 1050 degrees Celsius the backside (N-face) begins to decompose fairly readily. The temperature measured in our apparatus is measured with a thermo-couple (Type R/S) positioned outside of the growth ambient but inside a quartz sheath inserted into the susceptor. This temperature measurement technique allows for some error in calculating the exact temperature of the susceptor. We suspect this error to be less than 100 degrees Celsius.

For non-In containing nitride compounds (e.g. GaN, AlGaN, AlN), the preferred growth temperature range for non-backside evaporation is <900 degrees Celsius and the preferred growth temperature range for backside protection is ≧900 degrees Celsius. In the case of In containing substrates, the temperature for which backside protection is preferred is >500° C.

Backside evaporation is an issue for III-V nitride compounds grown at higher temperature, or for potentially advantageous growth conditions greater than 1130 degrees Celsius (depending on the growth conditions, GaN will decompose at lower temperature but depends on the $NH_3$ overpressure) on the FS GaN, as employed for smoothing the wafer out and achieving high material quality growth, particularly with Al-containing compositions.

Ideally, the superior crystalline material quality of the FS GaN substrates enables higher power, short wavelength blue, green and UV lasers and LEDs as well as higher frequency and higher power electronics, and higher temperature growth conditions may be necessary to enable the epitaxial material quality to be of comparable material quality to that of the substrate.

A preferred approach to eliminating this backside evaporation product issue is to deposit a backside protection layer to the backside of the substrate in contact with the susceptor. This layer serves as a substrate temperature stabilization layer and also can function as a support film, a contact metal and/or a backside protection, thermal contact improvement layer, and/or thermal contact uniformity improvement layer, depending on the layer used and the need.

A backside protection layer should be nominally inert to the growth environment, have a very low vapor pressure at growth temperatures and not contribute to background impurities in the epitaxial film. The backside protection may also serve as a thermal contact layer to the substrate when the substrate has slight bow or other non-planarity, thereby enabling better epitaxial growth and temperature uniformity across the wafer at higher temperatures. The material may be optically reflective or transparent for opto-electronics applications.

The backside protective layer can also serve as an ohmic contact layer for the as-grown device substrate, necessitating only the contacting of the p-layer, n-layer or undoped layer. In one embodiment, it can comprise a sputtered film of W or other material on the backside of the wafer. Other materials that can be used include noble metals. If an insulating layer is desired, $SiO_2$, AlN, or $Si_3N_4$ may be used. Ideally, the material chosen will have a coefficient of thermal expansion similar to the (Al,In,Ga)N material that is used. It may prove advantageous to employ a thin "glue" layer, e.g. Ti, to promote adhesion if a less reactive material is employed.

Pd, Ti or other material or metals can serve not only as protection but also as a contact layer eliminating post-growth processing steps in the device fabrication, e.g., of multiple layer dielectric stacks that are conductive and have engineered reflectivity at certain wavelengths.

Multiple materials may need to be deposited to the backside of the wafer to provide collective properties deriving from various materials (e.g., one layer to protect substrate evaporation and another layer to protect the substrate evaporation suppression layer and a third layer for bonding). The additional backside protection layer or layers may be removed post-growth to provide the desired epitaxial wafer characteristics.

Multiple materials can be deposited to enable improved processing of the device (e.g., one layer is used to improve ohmic contacts to substrate, and a second layer allows contact to the ohmic layer and improved or more robust wire-bonding).

We have observed that evaporative product continues to form during the entire growth and tends to deposit in the surface area. This observation suggests that the cause of backside degradation is more likely the high N-vapor pressure of the GaN material especially on the N-face of the FS GaN.

Nonetheless, if the roughness of the surface affects the amount of the evaporative product generated, then the finishing of the backside of the wafer to a certain finish is advantageous to reduce the backside evaporation product. Similarly, reducing the defect level of the backside will reduce the backside evaporative product. Finishing reduces the surface energy of the backside of the substrate and reduces the potential to evaporate. Additionally, finishing the backside of the wafer to a certain orientation alters backside evaporation products. Modification of the backside surface may also include reaction with another species to enable the backside to be inert to the growth environment.

Various orientations of GaN may have a lower susceptibility to decomposition at higher growth temperatures. This permits a resolution of the decomposition issue, by use of different orientation wafers or miscuts for the backside of the wafer. However, the backside evaporation product that is an issue for the backside of a Ga-face substrate preferably is overcome by the above-described methods of backside protection.

Backside evaporation also causes the substrate to stick to the susceptor, necessitating the substrate to be pried off the susceptor pocket, with consequent potential for damage to the epi layer and substrate by cracking or scratching. The deposit left behind on the susceptor also has the potential to significantly inhibit the formation of high quality material or the achievement of good uniformity on the next runs done using that susceptor pocket. Additionally, if the substrate adheres too strongly to the susceptor, then damage to the substrate due to TCE differences is a possible occurrence upon cool-down.

Backside protection can also be used to reduce bow in the substrate. Some x-ray data suggest that the breadth of the x-ray peak increases with MOVPE epi, but this occurrence is likely attributable to bow arising from the non-uniform production of the backside evaporative product. Materials that are advantageous to reduce bow in the substrate include materials that have a different CTE such that cool-down of the composite GaN substrate and backside protection pull the substrate wafer to a flat shape, and/or reduce or improve uniformity of the backside evaporative deposition to allow more uniform strain across the wafer, reducing bow therein.

The reactor design can be adapted for the purpose of protecting the backside of the wafer from evaporation, in a variety of manners. For example, $NH_3$ or nitrogeneous species can be flowed behind the wafer or the reactor can be designed in a manner effective to purge the interior volume of the reactor to dilute the evaporating product.

Interlayers Between Substrate and Epitaxial Layers
Low T GaN Interlayers on FS GaN The present invention contemplates the fabrication of GaN low T interlayers followed by a re-crystallization step to improve the as-grown surface morphology of the FS GaN. This approach enables a superior value-added FS GaN product by reducing growth time in the reactor that is otherwise required to smooth out the epitaxial surface. Concurrently, and fortuitously, low temperature interlayers can be used to reduce dislocations and certain types of defects, including inverted hex pits, grain boundaries, and inversion domains. The interlayer in some embodiments is used to absorb impurities and/or compensate native defects in the re-crystallized interlayer.

The invention also contemplates use of such interlayers for reducing tilt between domains and crystal grains in the FS GaN films during homoepitaxial growth as well as for reducing mosaicity, reducing inversion domains, and/or placing N-face and Ga-face crystals near one another to generate a uniform polarity epitaxial surface by allowing a high defect reducing affinity layer to absorb dislocations and crystal imperfections.

Strain Relief Layer

Considerable strain, either tensile or compressive, may be present in the FS (Al,In,Ga)N substrate material before epitaxial growth due to processing of the FS (Al,In,Ga)N wafer. This strain has the potential to cause the substrate to deform during growth, thereby inhibiting thermal contact and the achievement of high uniform quality epitaxial layer, as well as causing premature cracking of epitaxial layers on FS (Al,In,Ga)N.

The invention in another aspect contemplates a high temperature anneal step, preferably at a temperature >600° C., prior to growth, or in situ, to relieve the strain in the layer, with the ambient of the anneal being changed to protect the substrate surface and promote substrate strain relaxation. Under some circumstances it may be advantageous to anneal and relieve strain subsequent to epilayer growth but prior to dicing or cleaving the fully fabricated wafer.

As another approach, the invention contemplates growth on the substrate surface of (Al,In,Ga)N compounds and super-lattices of different lattice constant (Al,In,Ga)N alloys, to counteract the substrate strain and enable strain-free device growth on the substrate.

Another approach to relieve strain from the substrate and prevent it from propagating into the epitaxial layer is to use a graded transition between alloys of the epi layer and the substrate. Additionally, thin strained layers or superlattices can be employed with layers having less than the critical thickness, to relieve strain in the epitaxial device structure.

Other Interlayers

Interlayers between substrate and epitaxial layer or substrate and epitaxial layer plus device structure thereon can be employed to do one of the following but not limited to strain modification, dislocation reduction and optical reflection. The interlayers can be deposited at low temperature, high temperature, in superlattice configuration (one or more layers), graded in composition, graded in doping level, delta-doped (thin heavily doped layers) and chosen from III-nitrides, SiC, B—N, etc.

The following descriptions are not intended to limit the scope of the invention.

Grading of a homoepitaxial interlayer is defined as grading the composition of $Al_xIn_yGa_{1-x-y}N$ between the ranges of $0 \leq x \leq 1$ and $0 \leq y \leq 1$. Grading may occur in a convention of higher to lower parameter from substrate to epitaxy, respectively, or lower to higher parameter from substrate to epitaxy, respectively, where the designation of parameter refers to bandgap, lattice parameter or doping. Grading may occur in a linear, parabolic, exponential or other fashion depending on the structure. Strain introduced through deposition of the interlayer may affect bandgap and/or lattice parameter. Grading can be continuous or comprised of multiple discrete layers. Doping transitions, multiple graded layers and permutations of the above mentioned may be employed.

Interlayers may be uniform in composition, bandgap or doping.

Interlayers may be utilized in a superlattice configuration to enable specific reflectivity or absorption bands to be engineered, to enable dislocations to bend over and terminate propagation in the growth direction, or for other suitable applications.

Various temperatures, higher or lower than the standard deposition process, can be employed for interlayers enabling the resultant interlayer or epitaxial layer to effect defect reduction, crack reduction, smoother surfaces, etc.

Patterned interlayers may be utilized for defect reduction, crack reduction, or lateral growth there-from, patterned aspect to patterned aspect.

Multiple interlayers types as those described above may be utilized for desired end result.

The invention also contemplates the use of heteroepitaxial techniques in the fabrication of "dissimilar" homoepitaxial articles, where different substrate and epi (Al,In,Ga)N materials are employed.

Pause in Dopant for Nucleation of Growth

When using conductive substrates, of either n-type or p-type, the initiation of the dopant species too early during the nucleation of the epitaxial GaN layer growth on the FS GaN substrate can inhibit high quality homoepitaxial growth, by the introduction of high concentrations of Si and Mg or dopant, in general, at the interface, or the formation of other defects.

Figure 34:
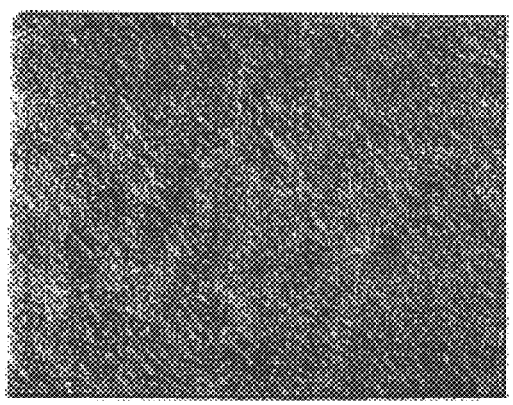
FIG. 34 shows the morphology of an LED structure on a 10 micron HVPE GaN/Sapphire base layer with a 1000 Angstrom thick undoped GaN nucleation layer.
Figure 35:
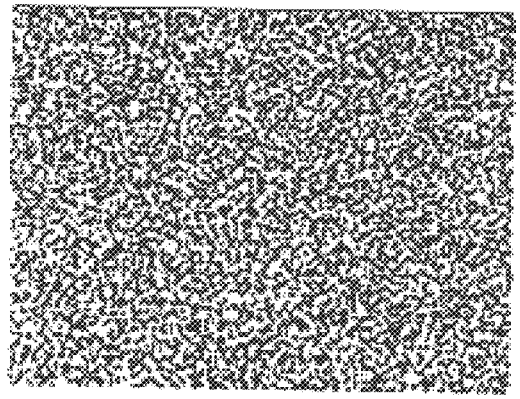
FIG. 35 shows a corresponding LED structure on a 10 micron HVPE GaN/Sapphire base layer without such an undoped nucleation layer.

By way of example, the premature initiation of the dopant in the homo-epitaxial growth of an LED structure can adversely effect the morphology and epitaxial quality of the epitaxial layer as shown in FIGS. 34 and 35. These Figures provide a comparison of surface morphologies of LED structures with n-GaN (layers 1E19 $cm^{-3}$) with and without an undoped GaN nucleation layer. FIG. 34 shows an LED structure with a 1000 Angstrom thick undoped GaN nucleation layer. FIG. 35 shows a corresponding LED structure without such an undoped nucleation layer. Inserting a thin undoped layer of material to allow nucleation and propagation of the substrate thus allows for high quality homoepitaxial growth.

The invention contemplates in such respect a <1500 A thick film of undoped GaN to be deposited on the substrate prior to the introduction of any dopant species. With this thickness of undoped film, the vertical electrical transport resistance is minimized and electron or hole transport across the interface can be realized.

Mass Transport for Improved Smoothing of Morphology

The smoothing of FS GaN morphology is necessary for high quality homo-epitaxial growth. The undesirable surface texture of the unfinished HVPE FS GaN substrate is an issue in high quality homo-epitaxial GaN growth. There are typically large mound-like hillock textures, which need to be smoothed out prior to epitaxial growth, or other substrate processing damage arising from producing a finished substrate which needs to be smoothed.

As described hereinabove, certain growth conditions can be utilized to do this more advantageously than others, but other methods can be employed to smooth the surface. Typically, several microns of MOVPE growth is necessary to smooth out a surface for epi, however, this occurs at a large cost in precursor usage (both trimethylgallium (TMG) and $NH_3$), and in time on the reactor.

The present invention in another aspect contemplates the use of mass transport to smooth surface texture of FS GaN films. There are several ways in which mass transport is advantageous over other methods of substrate smoothing: 1) it uses minimal amounts of precursors compared to MOVPE overgrowth, 2) the time to perform the mass transport can be dramatically reduced by adjusting the transport conditions (low P, ambient and temperature), 3) it eliminates the difficult task of finishing the wafer and the concomitant effect of inflicting damage to the substrate, or eliminates the final finishing steps, 4) it can be performed ex-situ to enable higher reactor throughput, 5) it is a controllable process that can be used to characterize defects in the material prior to epitaxial growth or shipment of the wafers, 6) it enables dislocation annealing and reduction of the substrate material near the epitaxial interface and 7) it enables a reduction or re-distribution of impurities in the substrate material to be achieved, thereby facilitating better epitaxial growth at the interface.

Method 1—Mass Transport of GaN Substrate

In one embodiment of mass transport smoothing of the unfinished or finished substrate surface, the substrate is annealed at higher temperature in an overpressure of ammonia or other N-species precursor and some ambient, either $H_2$ or $N_2$. Higher surface energy crystallographic features (hex hillocks, pits) are decomposed and this material redeposits or grows in the valley or inverted hex hillocks. Mass transport conditions can be modified to control the quality (defect level, conductivity, etc) of the mass transported material.

Figure 36:
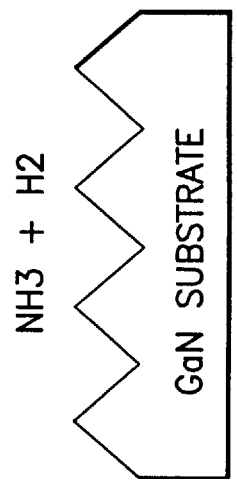
FIG. 36 schematically shows a GaN substrate heated to mass transport conditions in an ambient atmosphere of $NH_3$ and $H_2$.
Figure 37:
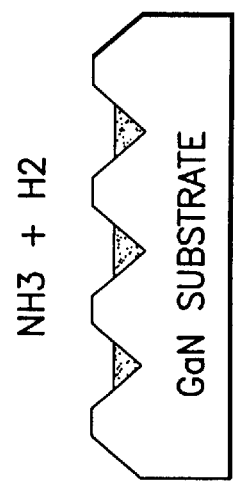
FIG. 37 shows the substrate as mass transport begins smoothing in the ambient.
Figure 38:
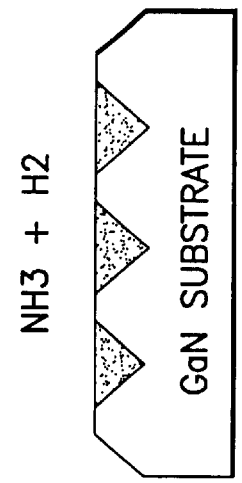
FIG. 38 shows the substrate at the point that mass transport has smoothed the entire surface.

The method is illustrated with reference to FIGS. 36–38. In FIG. 36, the GaN substrate is heated to mass transport conditions in an ambient atmosphere of $NH_3$ and $H_2$. FIG. 37 shows the substrate as mass transport begins smoothing in the ambient. FIG. 38 shows the substrate at the point that mass transport has smoothed the entire surface.

Mass transport conditions and times are adjustable to facilitate optimized smoothing and rate of smoothing by mass transport. Further, multiple process mass transport can be employed to optimize the mass transport smoothing characteristics of the substrate.

Method 2—Mass Transport of GaN Substrate Plus Epi Growth

Due to impurities in the substrate or native to reactor, such as S, Si, C, O, etc., mass transport can be inhibited from occurring and smoothing of the substrate surface can resultantly be inhibited.

The present invention contemplates in a further embodiment the growth of a thin layer having a thickness of a thousand Angstroms or less, to facilitate the mass transport smoothing by using mass transport with epitaxial quality MOVPE layers, to dilute the impurities from the substrate material and thereby achieve higher quality mass transport.

Such method of mass transport plus epi growth, to reduce susceptibility to mass transport problems arising from impurities in the substrate, can be practiced by introducing small amounts of trimethylgallium (TMG) while carrying out the mass transport, to dilute the gas phase from Ga and impurities from the substrate.

The use of epi layers of certain (Al,In,Ga)N compositions can also be used to facilitate the preferential smoothing of a certain facet of the substrate unfinished surface. This approach takes advantage of the fact that certain atoms (e.g., Al, Ga and In) have an affinity for certain crystallographic planes, offcuts or faces in GaN, which allows quicker smoothing for subsequent epi. Lattice matched mass transport plus epi, as well as superlattice epi mass transport, can be used to facilitate smoothing and defect reduction of the epitaxial substrate surface.

Method 3—Mass Transport Plus Surfactant

Mass transport by either Method 1 or Method 2 can be enhanced by the addition of a surfactant to smooth out the surface of the epi layer at higher rate. Bismuth and other chemicals can be employed as surfactants to aid the propagation of certain (Al,In,Ga)N crystallographic planes preferentially over others.

Method 4—Mass Transport Plus Dopant Incorporation

Mass transport is conducted by either Method 1, Method 2 or Method 3, while adding charge compensating impurities which can negate native and other impurities-related charges in the mass transport film which has been deposited. Intentional doping or impurity incorporation at the interface can be employed to modify electrical properties (charge, conductivity, conductivity type, charge neutrality, etc.). Intentional dopant incorporation can include but are not limited to one or more of the following: Mg, Be, Ca, C, Si, O, Ge, V, Fe, S, Cr, etc.

Growth on Finished Substrate

Homo-epitaxial growth on very hard and brittle materials, such as GaN and SiC, is problematic, in that aggressive finishing processes have been used to impart sufficient smoothness to the substrate surface. Such aggressive finishing processes, however, cause damage to the substrate. The present invention contemplates various techniques to remove this finishing damage, as performed during the in-situ growth of GaN.

One approach is to anneal the surface damage at growth temperature in $H_2$ or $NH_3$, or both.

A second approach to remove surface damage on the substrate is to etch back the substrate material with the $H_2$ and $NH_3$ ambient, to remove substrate material to beneath the region of damage on the substrate.

Other approaches include ex-situ surface preparation of the substrate, e.g., by RIE or KOH etch of the epitaxial surface of the wafer prior to growth.

Mask FS GaN Defects by Lateral Overgrowth or Lateral Filling

The invention in another aspect contemplates a method to remove the substrate defects in the unfinished or finished substrate material, in particular pits and dislocations defects. The method includes the step of selectively masking the defective area with $SiO_2$, $Ga_2O_3$, SiN or other suitable mask material, to inhibit growth.

Figure 40:
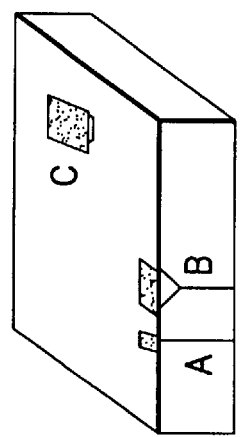
FIG. 40 shows the substrate with a mask applied to the defect regions.
Figure 41:
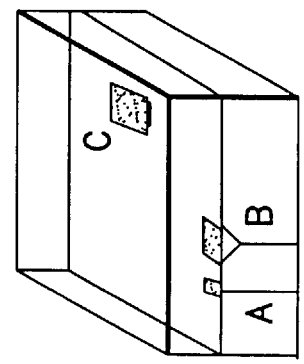
FIG. 41 shows the substrate with lateral overgrowth of the masked defects.

The general process to mask and lateral over-grow defects present in the FS GaN substrate surface is illustrated with reference to FIGS. 39–41.

Figure 39:
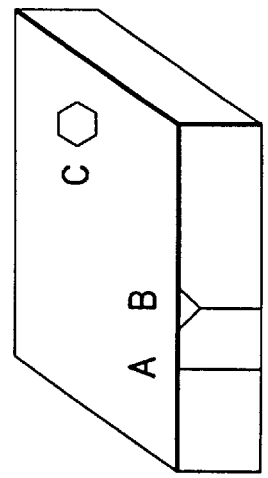
FIG. 39 shows the substrate with defects including dislocation defect (A), dislocation plus inverted hex pit (B), and inverted hex pit (C).

FIG. 39 shows the substrate with defects including dislocation defect (A), dislocation plus inverted hex pit (B), and inverted hex pit (C). FIG. 40 shows the substrate with a mask applied to the defect regions. FIG. 41 shows the substrate with lateral overgrowth of the masked defects.

The mask is selectively deposited in the defect, by electrolytic techniques, by sputtering a film, or using other suitable technique, then the mask is removed, e.g., through RIE, or by chemical mechanically polishing (CMPing) the substrate to reveal the masked defects, or by thermal oxidation to oxidize the substrate followed by stripping of the oxide from the wafer by CMP or other method like RIE (with the assumption that the oxide around the defect grows thicker than the oxide on the planar surface and will fill in the defect to allow overgrowth easily).

Electrolytic techniques can be used if the defects have a different electrical activity than the bulk of the material. Blanket masking followed by selective stripping of the mask material around the defects is more difficult to accomplish, and is accordingly less preferred.

Other methods of selective masking of the defects can be employed. Once the mask is selectively deposited, the epitaxial growth is performed and conditions are adjusted to smooth over or laterally grow over the defects, thus eliminating them.

Surfactant Addition

In a further aspect, the invention contemplates addition of surfactant into the growth ambient of the reactor during epitaxial growth to facilitate and enhance the smoothing of HVPE GaN unfinished or finished materials. The surfactant enables preferential growth on certain crystallographic facets and inhibits growth on others. The surfactant can also be utilized to aid in polytype fixing.

Growth conditions can be optimized or multiple process steps can be used to tailor the smoothing of the unfinished or finished substrate surface.

Illustrative surfactants include indium, due to its high elemental vapor pressure at elevated temperature, and bismuth, since it does not incorporate in GaN at high concentrations.

Preferred surfactants modify the growth mechanism of crystallographic propagation for selective propagation of crystal orientations, thereby smoothing growth, but do not incorporate appreciably into the growing epitaxial layer.

Figure 42:
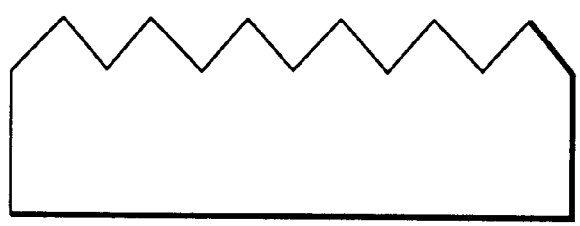
FIG. 42 in simplified elevation view schematically depicts an FS GaN substrate, showing the surface conformation thereof.
Figure 43:
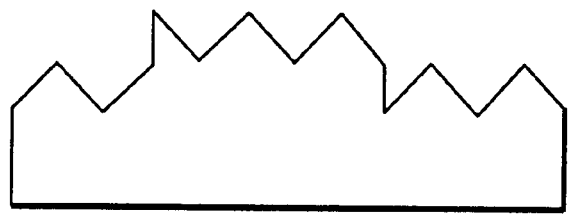
FIG. 43 shows the mesa etched FS GaN substrate surface, with a mesa upwardly extending from the main etched substrate surface.
Figure 44:
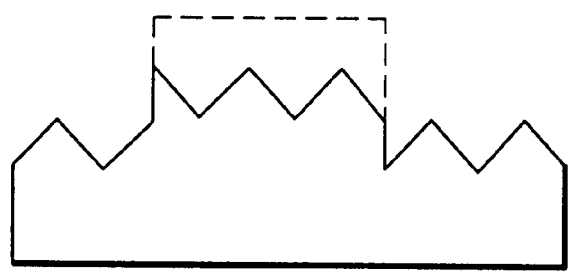
FIG. 44 shows epitaxial growth on the mesa to produce enhanced smoothing of the epi surface.

Mesa Etched(Patterned) FS GaN Layers for Regrowth and Facilitation of Smoothing and Defects Reduction The invention in another aspect contemplates etching of mesas on the FS GaN substrate to enable quicker smoothing growth of FS GaN substrate surface. This approach allows dislocations, planes and facets to propagate to the mesa edge, to achieve termination and annihilation of defects and crystallographic planes at the mesa edge. The general process is illustrated with reference to FIGS. 42–44.

This mesa etching technique involves a homoepitaxial or homogeneous material (III-V nitride) technique that forms a smaller or larger mesa geometry than the final device structure and the mesa is made larger or smaller by growth to accommodate the final device structure.

In one embodiment, a growth-inhibiting mask is placed on the mesa-etched area to prevent growth from occurring. This technique enables reduced strain fields from the substrate into the epi and enables higher mismatch compositions to occur without relaxation, as well as thicker structures to be realized, e.g., VCSELs and other device structures.

In another embodiment, epitaxy and epitaxy plus device structure may be deposited on posts or mesas in the substrate surface which have been preferentially defined in the substrate surface by etching, mechanical removal, and other means. Epitaxy on these post can be performed to effect reduced dislocation and crack reduction as well as other advantageous effects. Growth conditions can be modified to reduce the dislocation of the epitaxial material on the posts or mesas as well as create a uniform surface level by lateral over growth. The trenches may or may not be inhibited from nucleation of growth of epitaxial material there-in by one following but not limited to; masking, orientation modifications, native materials which have been made dissimilar, oxides, mechanical damage to change surface energy, etc.

Mesa or post geometries can be modified to various fundamental and combinations of fundamental shapes such as circles, squares, rectangles (stripes) and may be oriented on the substrate surface is certain preferred orientation in plane to generate desired affect.

Various specific aspects of the invention are more fully described below.

In applications of the invention employing p-type GaN, the desired resistivity of such material is lower than 1.0 ohm-cm, more preferably lower than 0.4 ohm-cm, and most preferably less than 0.1 ohm-cm.

GaN material in accordance with one specific aspect of the invention has less than $1E8$ $cm^{-2}$ and preferably less than $1E7$ $cm^{-2}$ dislocation density. Low dislocation density enables higher (dopant) Mg incorporation.

A p-type GaN film of preferred character has $>1E19$ $cm^{-3}$ Mg, with a dislocation density of less than $1E7$ $cm^{-2}$ and more preferably less than $5E6$ $cm^{-2}$. Another preferred p-type GaN film has $>5E19$ $cm^{-3}$ Mg with a dislocation density less than $5E7$ $cm^{-2}$ and more preferably less than $1E7$ $cm^{-2}$. A still further preferred p-type GaN film has $>1E20$ $cm^{-3}$ Mg with a dislocation density less than $5E8$ $cm^{-2}$ and more preferably less than $1E8$ $cm^{-2}$.

Concerning methods (mechanisms) of smoothing hexagonal facets on FS GaN unfinished surfaces, one method involves hexagonal facets propagating in such manner as to form truncated hexagonal faceted structures wherein the hexagonal truncated area grows by propagation of the hex facet in a <10 degrees vicinal surface propagation mode.

Another smoothing method or mechanism effects propagation of the hexagonal facets through a range of vicinal surface off of the original surface plane (and potentially other planes and vicinal cuts) and smoothing the surface in a truncated manner.

A still further smoothing method utilizes the creation of new c-planes in the smoothing process.

Various combinations of more than one of the above approaches may be employed in effecting smoothing.

A particularly preferred homoepitaxial layer in the broad practice of the invention is one which has been grown above its pseudomorphic thickness and generates <100 times more dislocations in the epitaxial layer, with a most preferred material having less than one order of magnitude of dislocations in epitaxial layer, e.g., an epi layer with less than 1E8 cm$^{-2}$ and more preferably an epi layer less than 1E7 cm$^{-2}$.

The following is a specific illustrative example of a VPE process to which the process of the invention is usefully applied.

A substrate is cleaned, then loaded onto a susceptor inside a reactor vessel. The reactor vessel is purged with inert gas until the reactor ambient has been purged of air. The process gas ambient is changed to the growth ambient, which protects the GaN substrate material during heat-up. The substrate is heated to growth temperature. Once the temperature for growth is reached, typically around 1100 degrees Celsius a cleaning process is completed in the reactor ambient to clean the substrate surface.

Next, precursors including, but not limited to, TMG, TMA, TMI, GaCl$_3$, NH$_3$, amines, etc., are introduced into the reactor and decompose on the substrate surface to form the epitaxial thin film material. The precursors and ambient are modified during the growth period to enable structures comprising different layers of AlInGaN of p, n or undoped conductivity type to form device structures.

Once the desired thickness and number of layers are deposited, the precursors are turned off and the reactor begins to cool. Process gases are used during cooling to prevent damage to the epitaxial layer. Once the wafer is cooled the reactor is purged with an inert gas and then the wafer is unloaded and subjected to the next desired process (device fabrication, characterization, etc.).

High quality homo-epitaxial epi layers on GaN substrates may be verified by one or more of the following: optical photo-pumping measurements, atomic force microscopy, positron analysis, transmission electron microscopy, x-ray analysis, secondary ion mass spectroscopy, as well as by other techniques.

With respect to the growth environment, a CTE match of susceptor and susceptor coating will enable longer lifetime of susceptor to be achieved, as well as eliminate potential for cracking of the susceptor coating and leaching of impurities from the susceptor core (e.g. graphite). The sensitivity of the epi process to the susceptor components in practice of the process of the invention is surprising, because GaN growth on other surfaces such as AlN, sapphire and SiC are not sensitive to bare susceptor components.

Controlled reactor flow and ambient may be necessary in some instances to achieve substrate temperature and substrate temperature uniformity due to cooling effects of the substrate.

GaN epi on FS GaN demonstrates well-defined step structure, having a well-defined, parallel and uniform step width without indication of step bunching. Step density is a function of crystal orientation.

It will be appreciated, consistent with the introduction hereto, that although the invention has been described with particular reference to GaN herein in various embodiments, all III-V nitride materials are contemplated as being within the broad scope of the invention herein described.

Illustrative devices utilizing the homoepitaxial approach of the present invention are described below.

Devices on GaN Substrates

UV LEDs

Devices grown on conventional substrates (e.g. sapphire and SiC) work well, but do not yet perform at the level desired by end-users due to substrate material compatibility and quality issues. High material quality, low dislocation density, lattice-match and CTE match is extremely important for many devices currently being developed or commercialized in the GaN field such as lasers, UV LEDs, AlGaN/GaN high electron mobility transistors (HEMTs), etc. These qualities are not only important for existing device structures being developed, but enable other device structures (i.e., high Al% device structures or other highly strained device structures) to be achieved that are not currently feasible due to the high strain between substrate and epi and the resultant limitation of the quaternary alloy compositional range.

Various device characteristics show the high quality of the GaN substrate and the epitaxial layers grown thereon and the positive impact of a high quality substrate on the resultant device layers.

Figure 45:
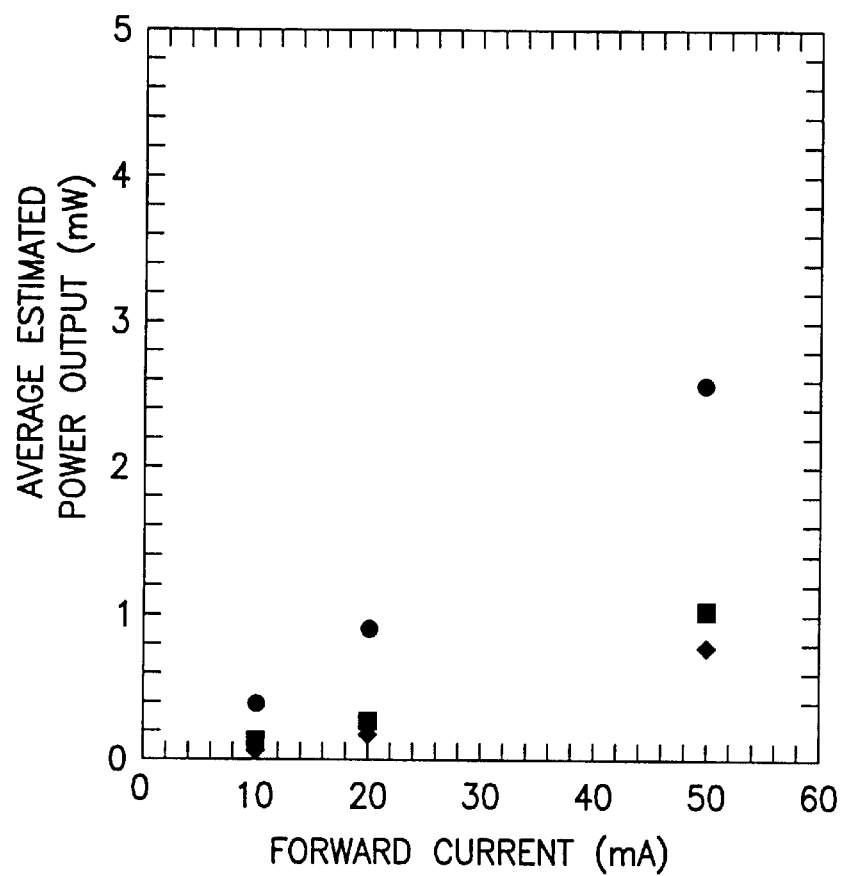
FIG. 45 is a graph of average estimated power output, in milliwatts (three devices) as a function of forward current, in milliamps, of InGaN double heterostructure(DH) LED devices on various substrates.

Using the same device design and fabrication steps, UV LEDs on FS GaN exhibited a four-to-five fold improvement in output power characteristics compared to devices on alternative substrates as demonstrated in FIG. 45.

UV LEDs are known to improve with increasing material quality. For example, UV LEDs on ELOG or LEO GaN demonstrate an improvement of 20% compared to growth directly on sapphire. Growth on FS GaN in accordance with the present invention was found to increase LED output power by a factor of four to five times compared to same device structure on sapphire. This is a substantially greater level of improvement than the ELOG layer in which the device traverses several low and high dislocation areas, a fact indicative of the vastly superior quality of devices in accordance with the present invention. FS GaN has a more uniform dislocation density across the entire area of the device and a substantially lower average number of dislocations in the device.

Photo-voltaic Detectors

Figure 46:
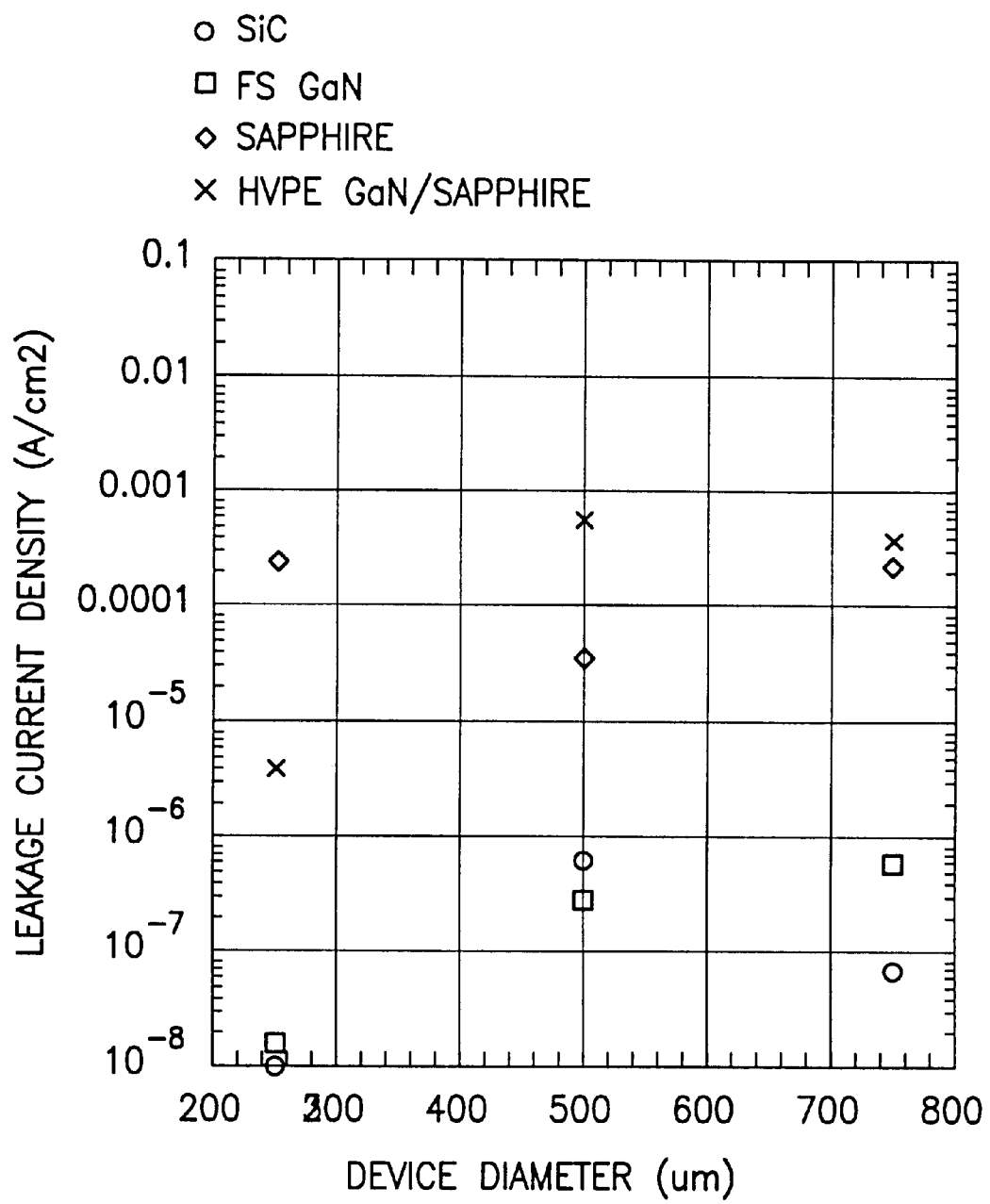
FIG. 46 is a graph of best reverse leakage current density at −10V, as a function of device diameter, in micrometers, for 0.25 micron I-thickness PINs on FS GaN, SiC and HVPE GaN/sapphire.

High quality photo-voltaic detectors in accordance with the invention have been fabricated on FS GaN substrates, having electrical characteristics comparable to or better than GaN photo-voltaic detectors on alternative substrates. This is shown in FIG. 46, which is a graph of best reverse leakage current density at −10V, as a function of device diameter, in micrometers, for 0.25 micron I-thickness PINs on FS GaN, SiC, sapphire and HVPE GaN/sapphire.

Although devices such as PIN structures and LEDs have favorable device characteristics, the substrates demonstrate some novel issues when attempting MOVPE-growth on them. The growth of GaN epitaxial layers on FS GaN in application to such devices constitutes another aspect of the present invention.

Because of the lack of a FS GaN substrate of suitable quality and size, there has been limited investigation in various crystallographic substrate orientations for epi growth. Some possible effects of substrate orientation on epitaxial growth include the following: growth mechanism; morphology (mis-orientation to <11$\bar{2}$0> on the N-face of the GaN substrate from zero to four degrees reduced hillock formation); crystalline quality; film stoichiometry; intentional and unintentional impurity incorporation; strain; carrier transport (hole-mass has been calculated to be lighter in non (0001) planes, which can have dramatic impact on the p-type doping of GaN; in addition, orientation affects piezoelectric field and strain affects transport properties); optical properties (non-0001 orientation is calculated to have higher optical gain and GaN/AlGaN structures with {1$\bar{1}$00} orientation have applicability to lower threshold current densities in lasers; piezoelectric field affects strain and optical interband absorption properties and is dependent on orientation);

polishing; finishing; RIE; improved AlInGaN compositional control and range; contacts; impurity incorporation and other device fabrication effects. For the purposes of this disclosure, the Ga-face and N-face of a GaN material are taken to be slightly miscut and to exhibit some step structure.

One significant advantage of FS GaN is fabricating without the requirement of interlayer structures, but in some applications, for example, for morphology smoothing and elimination of defects, interlayers may be advantageous.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art. The invention therefore is to be broadly construed, consistent with the claims hereafter set forth.

What is claimed is:

1. A method of forming a III-V nitride homoepitaxial layer on a corresponding III-V nitride material substrate, comprising depositing the III-V nitride homoepitaxial layer by a VPE process using Group III source material and nitrogen source material under deposition conditions including V/III ratio in a range of from about 1 to about $10^5$, nitrogen source material partial pressure in a range of from about 1 to about $10^3$ torr, growth temperature in a range of from about 500 to about 1250 degrees Celsius, and growth rate in a range of from about 0.1 micron per hour to about 500 microns per hour.

2. The method of claim 1, wherein the III-V nitride homoepitaxial layer comprises a nitride compound selected from the group consisting of AlN, AlInN, AlGaN, AlInGaN, InN, InGaN, and GaN.

3. The method of claim 1, wherein the III-V nitride homoepitaxial layer comprises GaN.

4. The method of claim 1, wherein the III-V nitride material substrate is a free-standing substrate.

5. The method of claim 1, wherein the III-V nitride material substrate is a free-standing finished substrate.

6. The method of claim 1, wherein the III-V nitride material substrate is a free-standing unfinished substrate.

7. The method of claim 1, wherein the III-V nitride material substrate is a free-standing chemical mechanical polished substrate.

8. The method of claim 1, wherein prior to the depositing step, the substrate is subjected to heat-up in an ambient to a temperature in said growth temperature range, wherein said ambient includes one or more species selected from the group consisting of hydrogen, nitrogen, argon, helium, neon, hydrogen chloride, and mixtures of two or more of the foregoing.

9. The method of claim 1, wherein the growth temperature is in a range of from about 1000 to about 1250 degrees Celsius.

10. The method of claim 1, wherein the growth temperature is >1050 degrees Celsius.

11. The method of claim 1, wherein the growth temperature is substantially about 1050 degrees Celsius.

12. The method of claim 1, where the homoepitaxial layer is at least 0.5 microns in thickness.

13. The method of claim 1, where the homoepitaxial layer is at least 3.0 microns in thickness.

14. The method of claim 13, wherein the III-V nitride material substrate is a free-standing unfinished substrate.

15. The method of claim 1, wherein said process conditions include V/III ratio of from about $10^1$ to about $10^5$.

16. The method of claim 1, wherein said process conditions include V/III ratio of greater than about $10^4$.

17. The method of claim 1, wherein said process conditions include V/III ratio of from about $10^3$ to about $5 \times 10^4$, nitrogen source material partial pressure of from about 20 to about 400 torr, growth temperature of from about 1000 to about 1150 degrees Celsius, and growth rate of from about 0.5 to about 10 microns per hour.

18. The method of claim 1, wherein said VPE process comprises an MOVPE process.

19. The method of claim 1, wherein the substrate has a crystallographic orientation selected from the group consisting of (0001), (000$\bar{1}$), and offcuts thereof.

20. The method of claim 1, wherein the substrate has a crystallographic orientation selected from the group consisting of {0001}, {11$\bar{2}$0}, {1$\bar{1}$00}, and offcuts therefrom.

21. The method of claim 1, wherein the substrate is GaN and the epitaxial layer is deposited on the Ga face of the substrate.

22. The method of claim 1, wherein the substrate is GaN and the epitaxial layer is deposited on the N face of the substrate.

23. The method of claim 1, wherein said VPE process comprises an HVPE process.

24. The method of claim 1, wherein the III-V nitride material substrate is heated up to growth temperature in a heat-up effecting one or more of the steps of:
   (a) smoothing a deposition surface of the substrate;
   (b) removing damage on a deposition surface of the substrate;
   (c) removing contaminants on a deposition surface of the substrate;
   (d) reducing defect propagation at an interface of the III-V nitride homoepitaxial layer and the substrate in said depositing step;
   (e) eliminating new defect formation at an interface of the III-V nitride homoepitaxial layer and the substrate in said depositing step;
   (f) reducing electrically active defects in said III-V nitride homoepitaxial layer or substrate;
   (g) reducing substrate impurity outgassing in said depositing step; and
   (h) compensating charge at a homoepitaxial layer/ substrate interface.

25. The method of claim 24, wherein said heat-up comprises process conditions including nitrogen source material partial pressure in a range of from about 1 to about 1000 torr, ramp time in a range of from about 1 to about 1000 minutes, ramp rates in a range of from about 10 to about 1000 degrees Celsius per minute, and an ambient including one or more species selected from the group consisting of hydrogen, nitrogen, argon, helium, neon, hydrogen chloride, and mixtures of two or more of the foregoing.

26. The method of claim 24, wherein said heat-up comprises process conditions including nitrogen source material partial pressure in a range of from about 10 to about 400 torr, ramp time in a range of from about 1 to about 100 minutes, ramp rates in a range of from about 100 to about 400 degrees Celsius per minute, and an ambient including one or more species selected from the group consisting of hydrogen, nitrogen, argon, helium, neon, hydrogen chloride, and mixtures of two or more of the foregoing.

27. The method of claim 1, wherein said III-V nitride homoepitaxial layer is deposited in said depositing step on a deposition surface of the substrate having a crystallographic orientation that is offcut from (0001).

28. The method of claim 27, wherein the offcut defines an offcut angle in the range of from 0.1 to 10 degrees from (0001).

29. The method of claim 1, wherein said III-V nitride homoepitaxial layer is deposited in said depositing step on a deposition surface of the substrate having an offcut direction towards the <11$\bar{2}$0> direction.

30. The method of claim 1, wherein said III-V nitride homoepitaxial layer is deposited in said depositing step on a deposition surface of the substrate having an offcut direction towards the <10$\bar{1}$0> direction.

31. The method of claim 1, wherein said III-V nitride homoepitaxial layer is deposited in said depositing step on a deposition surface of the substrate having an offcut direction between <11$\bar{2}$0> and <10$\bar{1}$0>.

32. The method of claim 1, wherein the III-V nitride material substrate is cleaned with an aqueous acid cleaning composition before said depositing step.

33. The method of claim 1, wherein the III-V nitride material substrate is cleaned with an aqueous basic cleaning composition before said depositing step.

34. The method of claim 1, wherein the III-V nitride material substrate is cleaned to remove $NH_4Cl$ from the substrate before said depositing step.

35. A method of forming a III-V nitride homoepitaxial layer on a corresponding III-V nitride material substrate, comprising depositing the III-V nitride homoepitaxial layer by a VPE process using Group III source material and nitrogen source material under deposition conditions including V/III ratio in a range of from about 1 to about $10^5$, nitrogen source material partial pressure in a range of from about 1 to about $10^3$ torr, growth temperature in a range of from about 500 to about 1250 degrees Celsius, and growth rate in a range of from about 0.1 micron per hour to about 500 microns per hour, wherein the III-V nitride material substrate is transformed into a dissimilar compound on a deposition surface thereof and dissimilar compound is stripped, before said depositing step.

36. The method of claim 35, wherein the III-V nitride material substrate is oxidized on a deposition surface thereof and resulting oxide is selectively stripped, before said depositing step.

37. The method of claim 35, wherein the III-V nitride material substrate is oxidized for smoothing of the substrate before said depositing step.

38. The method of claim 1, wherein the III-V nitride material substrate is cleaned by RIE before said depositing step.

39. The method of claim 1, wherein said III-V nitride homoepitaxial layer is deposited in said depositing step on a deposition surface exposed by RIE or wet etch before said depositing step.

40. The method of claim 1, further comprising impurity addition in said depositing step.

41. The method of claim 1, further comprising a multi-step smoothing process.

42. A method of forming a III-V nitride homoepitaxial layer on a corresponding III-V nitride material substrate, comprising depositing the III-V nitride homoepitaxial layer by a VPE process using Group III source material and nitrogen source material under deposition conditions including V/III ratio in a range of from about 1 to about $10^5$, nitrogen source material partial pressure in a range of from about 1 to about $10^3$ torr, growth temperature in a range of from about 500 to about 1250 degrees Celsius, and growth rate in a range of from about 0.1 micron per hour to about 500 microns per hour, wherein said method further comprises a backside evaporative protection process.

43. The process of claim 42, wherein the backside evaporative protection process comprises applying to the substrate a material protecting a backside surface of the substrate from evaporation.

44. The process of claim 42, wherein the backside evaporative protection process comprises polishing a backside surface of the substrate.

45. The process of claim 42, wherein the backside evaporative protection process comprises chemical etching.

46. The process of claim 45, wherein the chemical etching comprises exposing a backside surface of the substrate to a hot acid or a hot base.

47. A method of forming a III-V nitride homoepitaxial layer on a corresponding III-V nitride material substrate, comprising depositing the III-V nitride homoepitaxial layer by a VPE process using Group III source material and nitrogen source material under deposition conditions including V/III ratio in a range of from about 1 to about $10^5$, nitrogen source material partial pressure in a range of from about 1 to about $10^3$ torr, growth temperature in a range of from about 500 to about 1250 degrees Celsius, and growth rate in a range of from about 0.1 micron per hour to about 500 microns per hour, wherein said method further comprises applying an epi interlayer to a deposition surface of the substrate before depositing the III-V nitride homoepitaxial layer.

48. The method of claim 47, wherein the epi interlayer comprises different lattice-matched or lattice-mismatched (Al,In,Ga)N compounds.

49. The method of claim 47, whereby morphology of the homoepitaxial layer formed by said method is improved, dislocation defects are reduced, in relation to a corresponding process lacking applying of said epi interlayer to the deposition surface.

50. A method of forming a III-V nitride homoepitaxial layer on a corresponding III-V nitride material substrate, comprising depositing the III-V nitride homoepitaxial layer by a VPE process using Group III source material and nitrogen source material under deposition conditions including V/III ratio in a range of from about 1 to about $10^5$, nitrogen source material partial pressure in a range of from about 1 to about $10^3$ torr, growth temperature in a range of from about 500 to about 1250 degrees Celsius, and growth rate in a range of from about 0.1 micron per hour to about 500 microns per hour, wherein said method further comprises annealing the substrate before depositing the III-V nitride homoepitaxial layer.

51. A method of forming a III-V nitride homoepitaxial layer on a corresponding III-V nitride material substrate, comprising depositing the III-V nitride homoepitaxial layer by a VPE process using Group III source material and nitrogen source material under deposition conditions including V/III ratio in a range of from about 1 to about $10^5$, nitrogen source material partial pressure in a range of from about 1 to about $10^3$ torr, growth temperature in a range of from about 500 to about 1250 degrees Celsius, and growth rate in a range of from about 0.1 micron per hour to about 500 microns per hour, wherein said method further comprises applying a surfactant to a deposition surface of the substrate for nucleation of the III-V nitride homoepitaxial layer thereon.

52. A method of forming a III-V nitride homoepitaxial layer on a corresponding III-V nitride material substrate, comprising depositing the III-V nitride homoepitaxial layer by a VPE process using Group III source material and nitrogen source material under deposition conditions including V/III ratio in a range of from about 1 to about $10^5$, nitrogen source material partial pressure in a range of from about 1 to about $10^3$ torr, growth temperature in a range of from about 500 to about 1250 degrees Celsius, and growth rate in a range of from about 0.1 micron per hour to about 500 microns per hour, wherein said method further comprises conducting a mass transport process to produce a smoothed morphology of the III-V nitride homoepitaxial layer.

53. The method of claim 1, wherein the III-V nitride material substrate before said depositing step is subjected to a treatment selected from the group consisting of polishing and etching.

54. The method of claim 1, wherein the III-V nitride material substrate before said depositing step is subjected to a masking treatment for masking of defects in the substrate, and said depositing step effects defect overgrowth and elimination.

55. A method of forming a III-V nitride homoepitaxial layer on a corresponding III-V nitride material substrate, comprising depositing the III-V nitride homoepitaxial layer by a VPE process using Group III source material and nitrogen source material under deposition conditions including V/III ratio in a range of from about 1 to about $10^5$, nitrogen source material partial pressure in a range of from about 1 to about $10^3$ torr, growth temperature in a range of from about 500 to about 1250 degrees Celsius, and growth rate in a range of from about 0.1 micron per hour to about 500 microns per hour, wherein said depositing step is carried out in a growth environment, and a surfactant is added to the growth environment during said depositing step.

56. The method of claim 1, further comprising forming a mesa in the III-V nitride material substrate before said depositing step and depositing said III-V nitride homoepitaxial layer on or laterally from said mesa.

57. The method of claim 56, wherein said mesa is of sufficient area to enable crystallographic propagation termination and dislocation termination in said depositing step.

58. The method of claim 56, further comprising masking an area around said mesa to prevent growth thereon during said depositing step.

59. The method of claim 56, further comprising etching an area around said mesa to contain growth in said area during said depositing step.

60. The method of claim 1, wherein the III-V nitride homoepitaxial layer and corresponding III-V nitride material substrate, each comprise GaN.

61. The method of claim 1, wherein the III-V nitride homoepitaxial layer and corresponding III-V nitride material substrate, each comprise AlGaN.

62. The method of claim 1, wherein the III-V nitride homoepitaxial layer and corresponding III-V nitride material substrate, each comprise AlInGaN.

63. The method of claim 1, wherein the substrate comprises free-standing GaN and the epitaxial layer is deposited by HVPE.

64. The method of claim 1, wherein the epitaxial layer is doped n-type, p-type or semi-insulating.

65. The method of claim 1, wherein the substrate is free-standing GaN, having a finished or unfinished character, and wherein the homoepitaxial layer is selected from the group consisting of AlGaN, InGaN and AlInGaN, InN, GaN, AlN.

66. The method of claim 1, wherein the layer and substrate have a sheet resistance greater than 1E5 ohms per square centimeter.

67. The method of claim 1, where the layer and substrate have a sheet resistance greater than 1E4 ohms per square centimeter.

68. A method of forming a III-V nitride homoepitaxial layer on a corresponding III-V nitride material substrate, comprising depositing the III-V nitride homoepitaxial layer by a VPE process using Group III source material and nitrogen source material, wherein the substrate is reposed on a susceptor surface during said depositing step, said method further comprising coating said susceptor surface with a corresponding III-V nitride material prior to reposing the substrate thereon for said depositing step.

69. A method of forming a III-V nitride homoepitaxial layer on a corresponding III-V nitride material substrate, comprising depositing the III-V nitride homoepitaxial layer by a VPE process using Group III source material and nitrogen source material, and including an anneal step in an ambient prior to said depositing step at a temperature >600 degrees Celsius to relieve the strain in the layer, with the ambient of the anneal being different from that of said depositing step to protect the substrate surface and promote substrate strain relaxation.

70. A method of forming a III-V nitride homoepitaxial layer on a corresponding unfinished III-V nitride material substrate, comprising depositing the III-V nitride homoepitaxial layer by a VPE process using Group III source material and nitrogen source material, wherein the substrate is subjected to a mass transport smoothing of a growth surface of said substrate, wherein said mass transport smoothing comprises at least one step selected from the group consisting of:
   a. annealing the substrate in an ambient comprising ammonia and $H_2$;
   b. growing a thin epitaxial layer having a thickness of not more than 1000 Angstroms to dilute impurities from the substrate material;
   c. adding a surfactant to smooth out the surface of the substrate; and
   d. adding charge compensating impurities to negate impurities-related charges.

71. A method of forming a III-V nitride homoepitaxial layer on a corresponding unfinished III-V nitride material substrate, comprising depositing the III-V nitride homoepitaxial layer in a growth ambient, by an HVPE process using Group III source material and nitrogen source material, with addition of surfactant into the growth ambient of the reactor during said depositing, to facilitate and enhance the smoothing of the substrate.

72. A method of forming a III-V nitride homoepitaxial layer on a corresponding unfinished III-V nitride material substrate, comprising depositing the III-V nitride homoepitaxial layer by a VPE process using Group III source material and nitrogen source material, wherein the substrate comprises FS (Al,In,Ga)N and said substrate is conditioned for said depositing, by oxidizing the FS (Al,In,Ga)N substrate in $O_2$, air, an air/inert gas mixture, or a wet mixture to create a thin oxide layer, and stripping the oxide layer in an alkali solution or etch removing same, to remove potential impurities from the substrate.

73. A method of forming a III-V nitride homoepitaxial layer on a corresponding unfinished III-V nitride material substrate, comprising depositing the III-V nitride homoepitaxial layer by a VPE process using Group III source material and nitrogen source material, wherein the homoepitaxial layer is doped, but wherein said doping is paused during a portion of said depositing, to form a film thickness of undoped material in said homoepitaxial layer of a sufficient thickness to eliminate interrupted morphology in growth of said homoepitaxial layer.

* * * * *